(12) United States Patent
Lee et al.

(10) Patent No.: US 8,323,553 B2
(45) Date of Patent: *Dec. 4, 2012

(54) METHOD FOR MANUFACTURING A SUBSTRATE WITH SURFACE STRUCTURE BY EMPLOYING PHOTOTHERMAL EFFECT

(75) Inventors: Tzong-Ming Lee, Hsinchu (TW); Ruoh-Huey Uang, Hsinchu County (TW); Kuo-Chan Chiou, Tainan (TW); Yu-Ming Wang, Taichung (TW); Yi-Ting Cheng, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 675 days.

This patent is subject to a terminal disclaimer.

(21) Appl. No.: 12/362,080

(22) Filed: Jan. 29, 2009

(65) Prior Publication Data

US 2009/0197011 A1   Aug. 6, 2009

(30) Foreign Application Priority Data

Jan. 31, 2008  (TW) ............................... 97103802 A
Dec. 31, 2008  (TW) ............................... 97151822 A

(51) Int. Cl.
  *B05D 3/06*  (2006.01)
  *B29C 35/08*  (2006.01)
  *B29C 59/16*  (2006.01)

(52) U.S. Cl. ........ 264/402; 427/553; 427/555; 427/557; 264/446; 264/479; 264/482

(58) Field of Classification Search .......... None
See application file for complete search history.

(56) References Cited

U.S. PATENT DOCUMENTS

| | | | |
|---|---|---|---|
| 7,087,523 B2 | 8/2006 | Grigoropoulos et al. | |
| 7,462,496 B2 * | 12/2008 | Malak | 436/524 |
| 7,834,331 B2 * | 11/2010 | Ben-Yakar et al. | 250/492.1 |
| 8,062,738 B2 * | 11/2011 | Yoon et al. | 428/208 |
| 8,207,256 B2 * | 6/2012 | Leu et al. | 524/430 |
| 8,226,878 B2 * | 7/2012 | Huo et al. | 264/400 |
| 2008/0004364 A1 | 1/2008 | Huo et al. | |
| 2008/0066549 A1 * | 3/2008 | Oldham et al. | 73/579 |
| 2008/0115817 A1 * | 5/2008 | Defries | 136/200 |
| 2008/0213542 A1 * | 9/2008 | Huo et al. | 428/172 |
| 2008/0241262 A1 * | 10/2008 | Lee et al. | 424/490 |

(Continued)

FOREIGN PATENT DOCUMENTS

CN  1894438 A  1/2007

(Continued)

OTHER PUBLICATIONS

Zharov et al., "Synergic Enhancement of Selective Nanophotothermolysis with Gold Nanoclusters: Potential for Cancer Therapy", Lasers in Surgery and Medicine, 37 (3), pp. 219-226, 2005 (no month), ISSN: 0196-8092.*

(Continued)

*Primary Examiner* — Marianne L Padgett
(74) *Attorney, Agent, or Firm* — Rabin & Berdo, P.C.

(57) ABSTRACT

A method for manufacturing a substrate with surface substrates by employing photothermal effect is described. Nanoparticles on the surface of the substrate excited by a beam convert light energy to thermal energy. The surface structure on the substrate is formed through the thermal energy generated by the excited nanoparticles. The substrate with plural pores is thus formed.

7 Claims, 22 Drawing Sheets

U.S. PATENT DOCUMENTS

| | | | |
|---|---|---|---|
| 2008/0268288 A1* | 10/2008 | Jin | 428/800 |
| 2010/0166976 A1 | 7/2010 | Lin et al. | |
| 2011/0064676 A1* | 3/2011 | Gobin et al. | 424/9.42 |
| 2011/0094573 A1 | 4/2011 | Wu et al. | |
| 2012/0009353 A1* | 1/2012 | Lee et al. | 427/532 |

FOREIGN PATENT DOCUMENTS

| | | |
|---|---|---|
| CN | 101519184 A | 9/2009 |
| JP | 2004-119686 A | 4/2004 |
| JP | 2004-143571 A | 5/2004 |
| JP | 2005-135982 A | 5/2005 |
| JP | 2006-038999 A | 2/2006 |
| JP | 2007-123450 A | 5/2007 |

OTHER PUBLICATIONS

Machine translation of JP2007-123450 A, Tanaka, published May 17, 2007.*

Learner et al., editors; Encyclopedia of Physics, second edition, excerpt "Plasmons" by Cheng et al., pp. 936-937; VCH publishers, Inc., New York, 1991 (no month).*

J. Sun et al., "The melting behavior of aluminum nanoparticles", Thermochimica Acta, 463 (2007; available online Jul. 17, 2007), pp. 32-40.*

Q. Jiang et al., "Size-dependent melting point of noble metals", Materials Chemistry and Physics 82 (2003, no month), pp. 225-227.*

Buffat et al., "Size effect on the melting temperature of gold particles"; Physical Review A, vol. 13, No. 6; Jun. 1976; pp. 2287-2298.*

Z.M. Ao et al.; "Size effects on the Kauzmann temperature and related thermodynamic parameters of Ag nanoparticles"; Nanotechnology, vol. 18; IOP publishing; 2007 (no month), 6 pages.*

Francesco Delogu; "Structural and energetic properties of unsupported Cu nanoparticles from room temperature to the melting point: Molecular dynamics simulations"; Physical Review B, vol. 72; 2005 (no month), pp. 205418-1 to 205418-9.*

* cited by examiner

METHOD FOR MANUFACTURING A SUBSTRATE WITH SURFACE STRUCTURE BY EMPLOYING PHOTOTHERMAL EFFECT

CROSS-REFERENCE TO RELATED APPLICATIONS

This non-provisional application claims priority under 35 U.S.C. §119(a) on Patent Application No(s). 097103802 filed in Taiwan, R.O.C. on Jan. 31, 2008 and Patent Application No(s). 097151822 filed in Taiwan, R.O.C. on Dec. 31, 2008 the entire contents of which are hereby incorporated by reference.

BACKGROUND

1. Field of the Invention

The present invention relates to a method for manufacturing a substrate, and more particularly to a method for manufacturing a substrate with surface structure by employing photothermal effect.

2. Related Art

Recently, many technologies were developed to form micro/nano-structure on surface of a substrate, such as nanoimprinting lithography (NIL), semiconductor manufacturing process or micro-electro-mechanical process (MEM) etc. Although these technologies can be used to fabricate micro/nano-structure, the fabricated process is complex and expensive. For example, when semiconductor manufacturing process or MEMS process is used to fabricate micro/nano-structure, the sample was treated by several processes, including spinning coat, exposure/development, etching and imprinting process. Therefore, it is difficulty and there is high cost to fabricate micro/nano-structure employing these technologies. The NIL technology also need many processes to fabricate template with micro/nano-structure on its surface and then imprint on a substrate. This technology also exhibits it is difficulty to manufacture micro/nano structure surface in large area.

During making a printed circuit board (PCB), there is a process for forming gold fingers (also called as an edge connector). The edge connector is used as an interface for connecting the PCB and outside element through inserting to the outside element. The gold fingers are made with gold because gold has superior conductivity and superior oxidation resistance. However, the cost of gold is very expensive, so only the gold finger is only partially formed with gold using platting or chemical bonding, such as bonding pad. During platting, it is necessary to appropriately control parameters, to avoid some questions such as contamination with other metal and bad adhesion etc.

Furthermore, a subtractive process and an additive process are the methods for making a conductive structure. For the subtractive process, the etching formulation and the etching angle errors result in copper residues. Thus, the subtractive process is not suitable for manufacturing fine circuits. The additive process needs a mask to define circuits, and then to manufacture circuits through copper-cladding processes such as plasma sputtering, electroplating, or electroless plating. In general, the flow of the additive process is rather complicated and the cost is relatively high. Therefore, a method for manufacturing conductive wires through inkjet technology is proposed.

Currently, the method for manufacturing conductive wires through the inkjet technology has already been applied in manufacturing flexible circuit boards. Conventionally, the inkjet technology is used to spray conductive ink with a low melting point on an organic substrate, so as to manufacture a flexible circuit board having conductive wires at a high speed and a low cost. However, the conductive ink should be sintered into a film at a high temperature to form conductive wires and meanwhile to enhance the conductivity thereof. During such sintering process, a sintering temperature of 200° C. is required, and the sintering duration should be over about 30 minutes. Accordingly, residual thermal stress is easily generated between the substrate and the formed conductive wires. Besides the heat treatment, another method is to use ultraviolet (UV) laser to sinter, but this method easily damages the substrate.

SUMMARY OF

This invention provides a method for manufacturing a substrate with surface structure by employing photothermal effect, which is a novel and simple method and can directly manufacture micro/nano-structure on surface of a substrate in large area through photothermal effect of nanoparticles. Compare with above technologies, the method for manufacturing a substrate with surface structure by employing photothermal effect according to this invention is rather simple, low cost, and possible to form pattern on surface of a substrate in large amount.

In one embodiment, a method for manufacturing a substrate with surface structure by employing photothermal effect involves steps of providing a substrate; distributing a plurality of nanoparticles on the provided substrate; irradiating the nanoparticles on the provided substrate with a specific wavelength, such that the nanoparticles convert irradiating energy (i.e. light energy) to thermal energy; and forming pores corresponding to the nanoparticles in surface of the provided substrate through the thermal energy generated by the nanoparticles.

In a case, the nanoparticles can form corresponding micro or nano pores in the surface of the provided substrate through the thermal energy generated by nanoparticles, and then the nanoparticles can be removed from the substrate where the pores are formed, the substrate with the pores in micro/nano level is obtained.

The nanoparticles may be directly distributed on the substrate. And, the nanoparticles can be removed from the substrate after the pores are formed in the surface of the substrate, thereby obtaining the substrate with the pores.

Alternatively, the nanoparticles may also be fixed on a transparent substrate (NTS). Then, the NTS is placed on the substrate, and one side of the transparent substrate having the nanoparticles is adjacent to the provided substrate. And, the nanoparticles can be removed from the substrate after the pores are formed in the surface of the substrate, thereby obtaining the substrate with the pores.

In view of the above, the method for manufacturing a substrate with surface structure by employing photothermal effect according to this invention form micro/nano-structure on/in surface of a substrate. Use of the method according to this invention to fabricate micro/nano-structure on/in surface of the substrate can exhibit several advantages, such as the fabricated process is more simple, cheaper, and the sample can be manufactured in large area.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

In this present invention, a substrate with surface structure(s) is manufactured based on the principle of surface plasma resonance (SPR). When nanoparticles are irradiated by a beam with a specific wavelength, the excited nanoparticles can convert light energy of the beam into thermal energy, thereby forming the surface structure on the substrate through the thermal energy and thus obtaining the substrate with a specific surface structure (for example, but not limited to, plural pores and a layer of a predetermined pattern). The principle of SPR may be explained as that, if the diameter of precious metal particles is much smaller than a wavelength of the irradiating beam, the electrons in the surface of the metal particles initiate collective dipole oscillation upon being excited by the irradiating beam, thereby employing polarization of the surface electrons, and producing resonance phenomenon of free electrons in the surface of the metal particles. Therefore, the light energy absorbed by the precious metal particles can be rapidly converted into thermal energy due to SPR.

The "photothermal effect" is defined as that, the light energy absorbed by the nanoparticle is converted into the thermal energy due to SPR after the nanoparticle is irradiated by a beam with a specific wavelength. Herein, terms, such as "a", "an" and "the," are not intended to limit to only a singular entity.

Figure 1:
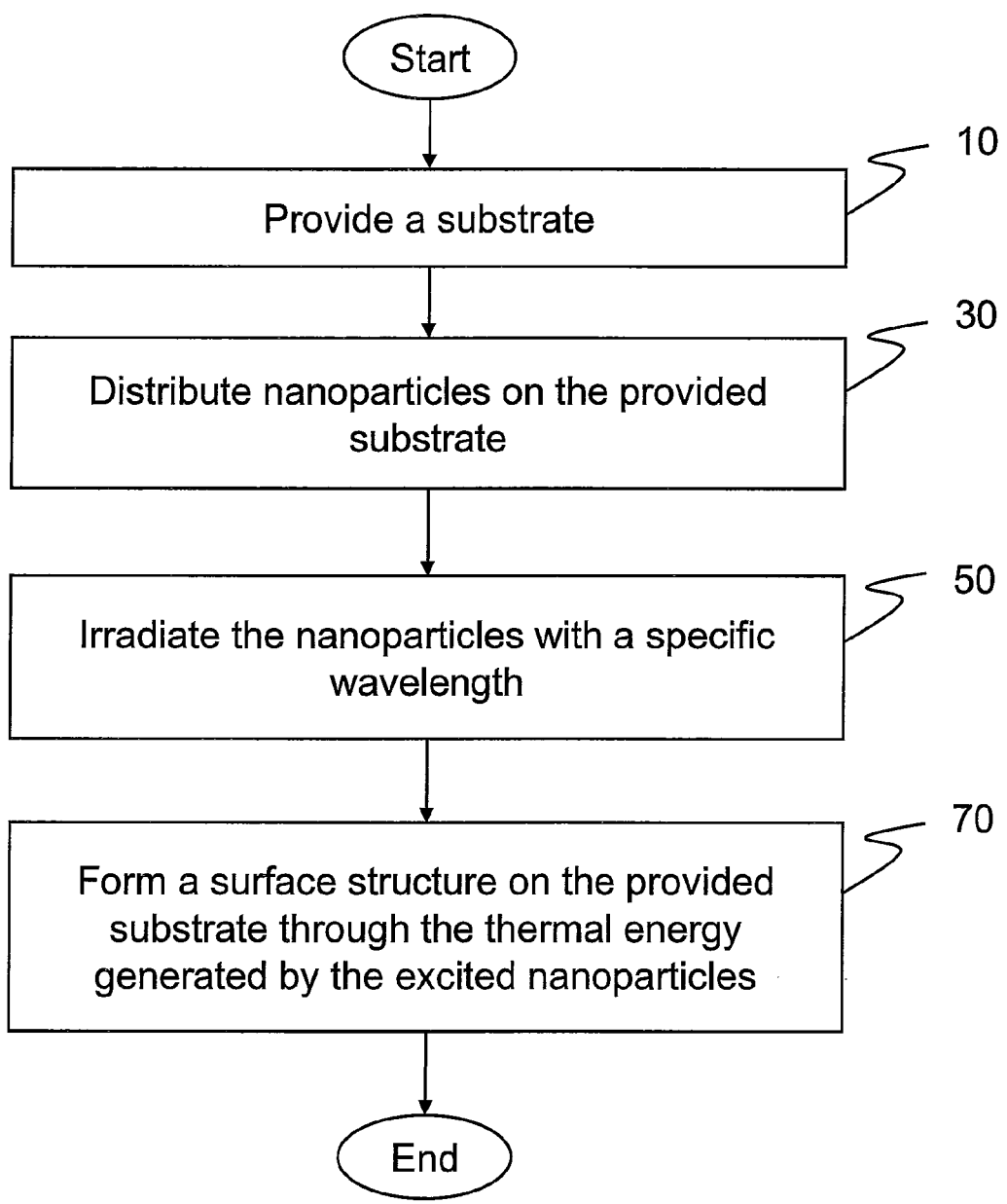
FIG. 1 is a general flowchart of a method for manufacturing a substrate with surface structure by employing photothermal effect according to a first embodiment of the present invention.

FIG. 1 shows a method for manufacturing a substrate with surface structure by photothermal effect according to a first embodiment of the present invention.

First, a substrate is provided (Step 10). The provided substrate may be made of, but not limited to, organic material(s), inorganic material(s) (for example, glass, metal, or ceramic) or any combination thereof.

Next, nanoparticles are distributed on the provided substrate (Step 30). The nanoparticles are made of a material capable of generating surface plasma resonance and photothermal effect. The nanoparticles may be metal nanoparticles, which is formed by, for example, (but not limited to) Au, Cu, Ag, Cd, Te, CdSe, or any combination thereof. The nanoparticle can be presented with a large particle aggregated by plural small metal particles with different materials or the same materials or aggregated by plural small metal particles with different particle sizes or the same particle sizes, or a particle structure with large size formed through bonding one or more metal particles to the surface of the larger particle by using surface modification. The particle structure with large size can be that, for example, the surface of metal particle with nano size or micro size is bonded with one or more nanoparticles, the surface of $SiO_2$ with nano size or micro size is bonded with one or more nanoparticles, or the surface of carbon tube is bonded with one or more nanoparticles, etc. The particle size of the nanoparticles used herein may be much smaller than a wavelength of the light for excitation. Moreover, the diameter, i.e. particle size, of the nanoparticles may be smaller than 500 nm. The nanoparticles are not restricted in shape, which may be, but not limited to, spheroid-shaped, ellipse-shaped, triangle-shaped, strip-shaped, bar-shaped, asteroid-shaped, or any other irregular three-dimensional geometric shape.

These nanoparticles used to be distributed on the provided substrate can have the same particle size, or have two or more particle sizes. These nanoparticles used to be distributed on the provided substrate can have the same material, or have two or more materials. These nanoparticles used to be distributed on the provided substrate can have the same shape, or have two or more shapes.

Then, light with a specific wavelength are used to irradiate the nanoparticles on provided substrate, so as to excite the nanoparticles to convert light energy into thermal energy (Step 50). Herein, the predetermined time for irradiating the nanoparticles is determined according to the following process parameters, such as a surface material of the substrate (i.e., the surface material contacting with the nanoparticles), a material of the nanoparticles, a particle size of the nanoparticles, a concentration of the nanoparticles, types of light for irradiation (for example, but not limited to, types and wavelengths of the light), and intensity of light for irradiation (for example, but not limited to, power).

Then, a surface structure is formed on the provided substrate through the thermal energy generated by the nanoparticles which are excited due to the plasma resonance (Step 70).

In this manner, the substrate with specific surface structure, e.g. the nano or micro pores or the layer of the predetermined pattern, may be obtained.

Figure 2:
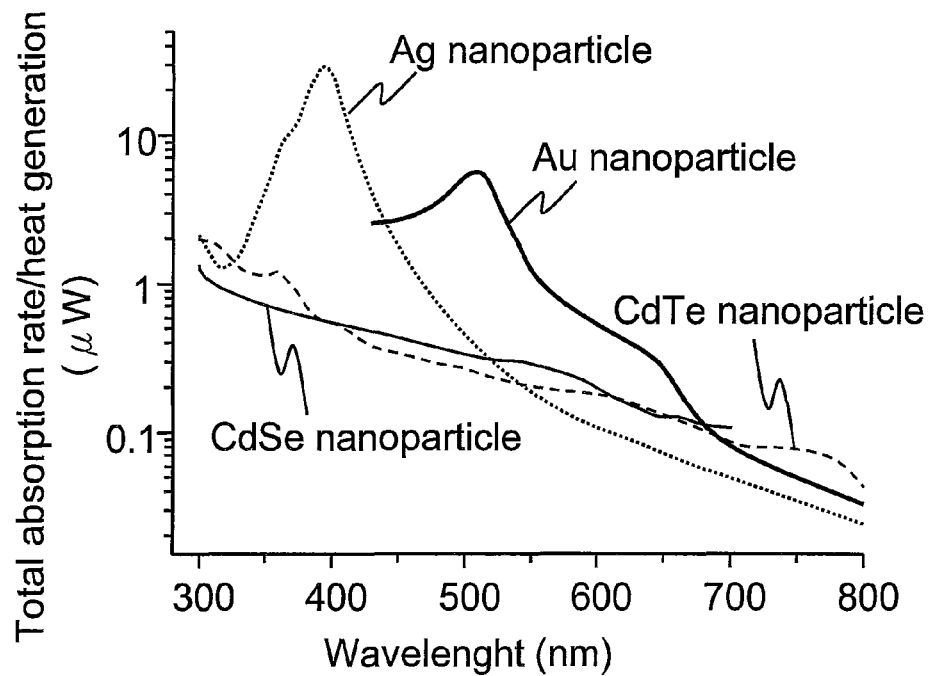
FIG. 2 shows the calculated rate of light energy dissipation in Au, Ag, CdTe and CdSe nanoparticles.

FIG. 2 shows the calculated rate of light energy dissipation in Au, Ag, CdTe and CdSe nanoparticles. In FIG. 2, Ag nanoparticle, Au nanoparticle, CdSe nanoparticle and CdTe nanoparticle, which have particle size of 60 nm and are within water, are individually irradiated by the beam with light flux of $5*10^4$ W/cm$^2$ (I0=$5*10^4$ W/cm$^2$). The vertical axle represents a ratio of total absorption rate to heat generation ($q_{tot}$), and a unit is μW. The total absorption rate represents the amount of the light energy absorbed by the nanoparticle. The heat generation represents the amount of the thermal energy generated by the nanoparticle. The lateral axle represents wavelength of the beam, and the unit is nm. Dielectric constant ($\in$o) of medium around the nanoparticle is equal to that ($\in$water) of water, that is, the dielectric constant is 1.8.

Referring to FIG. 2, compare with CdSe nanoparticle and CdTe nanoparticle, Ag nanoparticle and Au nanoparticle can generate a larger amount of the thermal energy when they are irradiated by a beam with a specific wavelength, i.e. absorption band for exciting SPR.

Photothermal effect relates to the absorption of SPR and SPR depends on the size, shape, and degree of particle-to-particle coupling.

Figure 3:
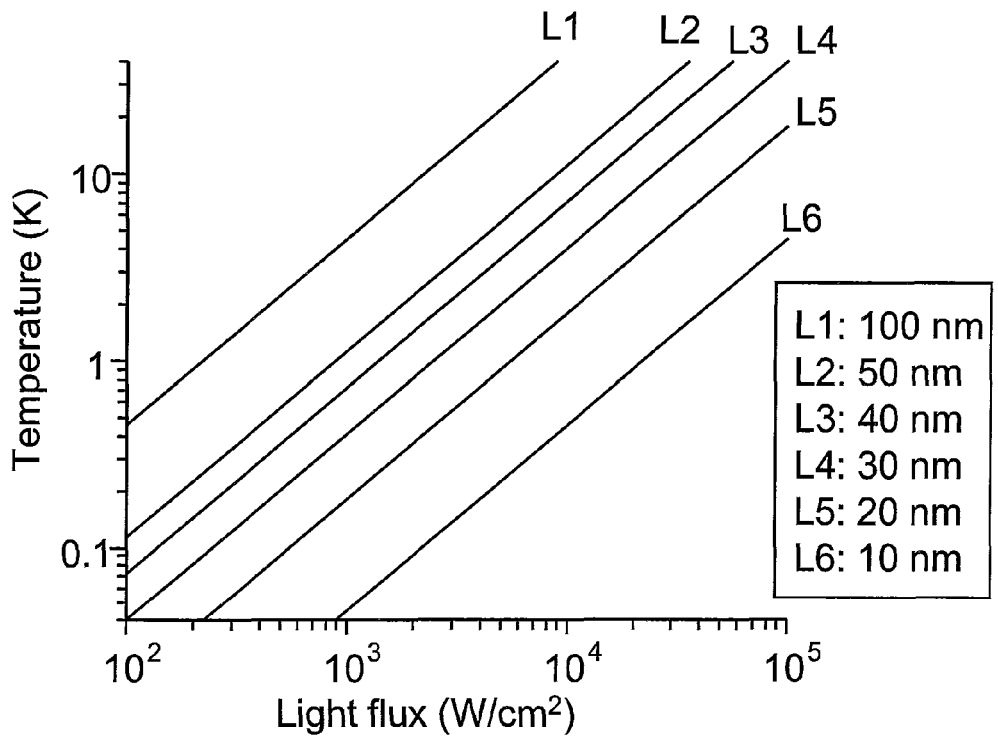
FIG. 3 shows the calculated temperature increase at the surface of single Au nanoparticle in water is a function of illumination power at the plasmon resonance.

FIG. 3 shows the calculated temperature increase at the surface of single Au nanoparticle in water is a function of illumination power at the plasmon resonance. In FIG. 3, the Au nanoparticles with particle sizes of 10 nm, 20 nm, 30 nm, 40 nm, 50 nm, and 100 nm and within water are individually irradiated by the beam with a wavelength of 520 nm ($\lambda_{excitation}$=520 nm). The vertical axle represents the temperate increase ($\Delta T_{max}$) caused by the thermal energy generated by single Au nanoparticle, and the unit is K. The lateral axle represents the light flux of the irradiating beam, and the unit is W/cm$^2$.

Referring to FIG. 3, the heat generated from an AuNP in water is increasing with particle size when illuminated the same light flux.

Furthermore, different types of the nanomaterials, such as nanopellet, nanoline, nanotube, etc., can be observed phenomenon of decreasing melting-point thereof. As to substances with the same material, under a macroscope scale, melting point depression is most evident in nanowires, nanotubes and nanoparticles, which all melt at lower temperatures than bulk amounts of the same material. Changes in melting point occur because nanoscale materials have a much larger surface to volume ratio than bulk materials, drastically altering their thermodynamic and thermal properties. This difference results from that, the nano-structured substance has larger specific surface area, such that thermodynamic and thermal properties of the nano-structured substance and the bulk substance have fairly large difference.

Figure 4:
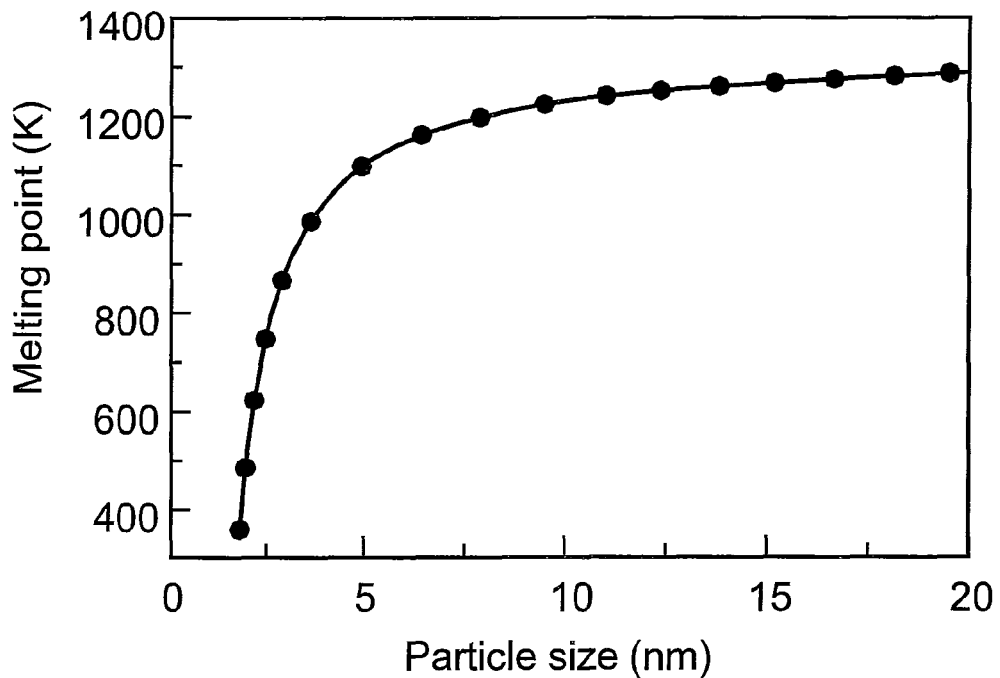
FIG. 4 shows relationship curves between particle size and melting-point of Au nanoparticle.

FIG. 4 shows the relationship curves between particle size and melting-point of Au nanoparticle. In FIG. 4, the vertical axle represents the melting-point ($T_m$) of the Au nanoparticle, and the unit is K. The lateral axle represents the particle size (2r) of the Au nanoparticle, i.e. the diameter of Au nanoparticle, and the unit is nm.

Referring to FIG. 4, when the particle size of Au nanoparticle is lower than 5 nm, the melting-points of Au nanoparticle decrease dramatically.

Hence, when the substrate with the pores is manufactured by employing the photothermal effect, the particle size of nanoparticles is decided according to melting-point and pyrolysis temperature of the provided substrate.

Since an amount of the thermal energy generated by the nanoparticles with small particle size is less than lager ones, the nanoparticles with the small and large particle sizes are simultaneously used when the substrate with the layer of the predetermined pattern is manufactured by employing the photothermal effect. Therefore, the layer of the predetermined pattern can be formed by melting the nanoparticle(s) with the small particle size to weld the nanoparticle(s) with the large particle size.

FIGS. 5A-5E show a method for manufacturing a substrate with surface structure by employing photothermal effect.

Figure 5A:
FIGS. 5A-5E are general flowcharts of a method for manufacturing the substrate with the surface structure by employing photothermal effect according to a second embodiment of the present invention.

First, a substrate 112 is provided, as shown in FIG. 5A. The substrate may be made of, but not limit to, organic material(s), inorganic material(s) (for example, glass, metal, and ceramic) or any combination thereof.

Figure 5B:
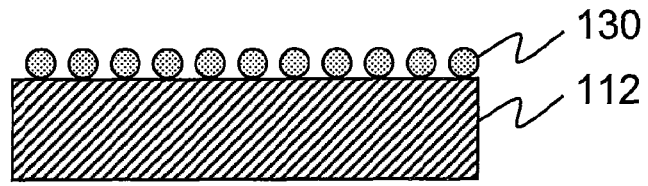

Next, nanoparticles 130 are distributed on the provided substrate 112, as shown in FIG. 5B. These nanoparticles 130 used to be distributed on the provided substrate can have the same particle size, or have two or more particle sizes. These nanoparticles 130 used to be distributed on the provided substrate can have the same material, or have two or more materials. These nanoparticles 130 used to be distributed on the provided substrate can have the same shape, or have two or more shapes.

Figure 5C:
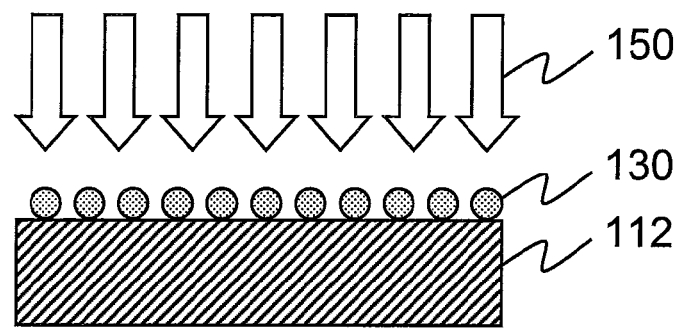

Then, the beam 150 with a specific wavelength are used to irradiate the nanoparticles 130 on the substrate 112, excited nanoparticles 130 can convert the light energy into thermal energy, as shown in FIG. 5C. At this time, the beam continuously irradiates the nanoparticles for a predetermined time. For example, the beam with a specific wavelength irradiates the nanoparticles for, but not limited to, about more than 5 seconds.

Figure 5D:
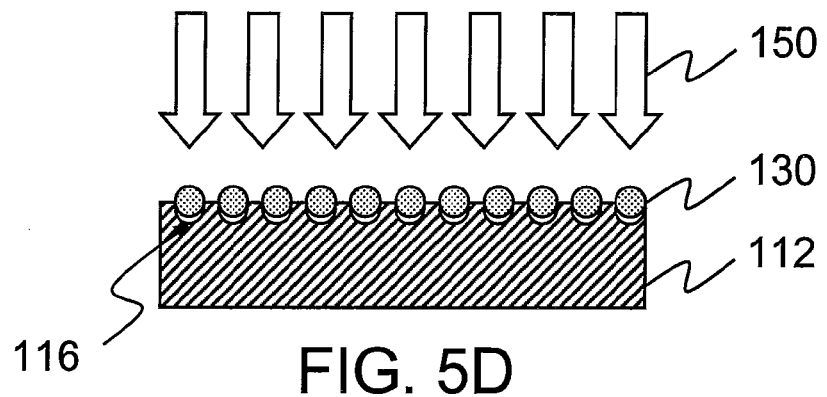

Then, a plurality of pores 116 corresponding to the nanoparticles 130 is formed on surface of the substrate 112 through the thermal energy generated by the nanoparticles 130 upon being irradiated by the beam, as shown in FIG. 5D.

Figure 5E:
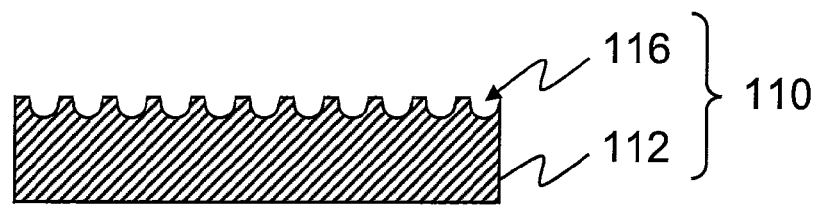

Finally, the nanoparticles 130 are removed from the substrate 112, the applied substrate 110 with pores 116 can be obtained, as shown in FIG. 5E.

Figure 6A:
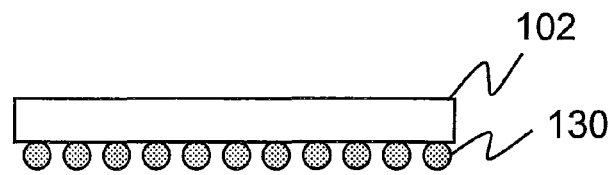
FIGS. 6A-6D are general flowcharts of a method for manufacturing the substrate with the surface structure by employing photothermal effect according to a third embodiment of the present invention.

Furthermore, the nanoparticles 130 also can bond on surface of another substrate 102 which is transparent, as shown in FIG. 6A. The transparent substrate 102 may be made of any transparent material capable of carrying the nanoparticles, for example, glass or quartz. These nanoparticles 130 used to be distributed on the provided substrate can have the same particle size, or have two or more particle sizes. These nanoparticles 130 used to be distributed on the provided substrate can have the same material, or have two or more materials. These nanoparticles 130 used to be distributed on the provided substrate can have the same shape, or have two or more shapes. Herein, a way, such as, but not limited to, spray printing, spin coating, coating, and covalent bonding, etc., can be used to fix the nanoparticles 130 on the transparent substrate 102. Based on the property of the transparent substrate 102, that is, the material of the transparent substrate 102, such as metal material, inorganic material, organic material or combination thereof, the way to fix the nanoparticles 130 on the transparent substrate 102 can be selected from a physical way and a chemical way. The physical way can be, for example, employing static adsorbability, ionic adsorbability or van der Waals' forces to fix the nanoparticles 130 on the surface of the transparent substrate 102. The chemical way can be, for example, forming a self-assembly monolayer in the surface of the transparent substrate 102 or surface modification of the nanoparticles 130 or the transparent substrate 102, to fix the nanoparticles 130 on the surface of the transparent substrate 102. Under the surface modification, the surface of the nanoparticles 130 or the surface of the transparent substrate 102 is modified, such that the nanoparticles 130 can be fixed on the surface of the transparent substrate 102 via the modified surface in chemical bonding, such as ion bonding, covalent bonding, etc., manner. After modifying the surface of the nanoparticles 130 or the surface of the transparent substrate 102, the surface thereof forms function groups thereon. The function groups can be, but not limited to, N-hydroxy succinimide (NHS) groups, amino groups, aldehyde groups, epoxy groups, carboxyl groups, hydroxyl groups, acyl groups, acetyl groups, hydrazonos, hydrophobic groups, thiol groups, photoreactive groups, cysteine groups, disulfide groups, alkyl halide groups, acyl halide groups, azide groups, phosphate groups, or their combination, etc.

Figure 6B:
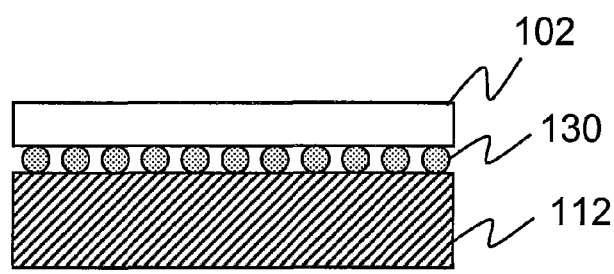

One side of the transparent substrate 102 having the nanoparticles 130 fixed thereon faces and is placed on a surface of the substrate 112 to be desired to form the pores thereon, so that the nanoparticles 130 are distributed on the substrate 112 and contact with the surface of the substrate 112. In other words, the nanoparticles 130 are sandwiched between the transparent substrate 102 and the substrate 112, as shown in FIG. 6B.

Figure 6C:
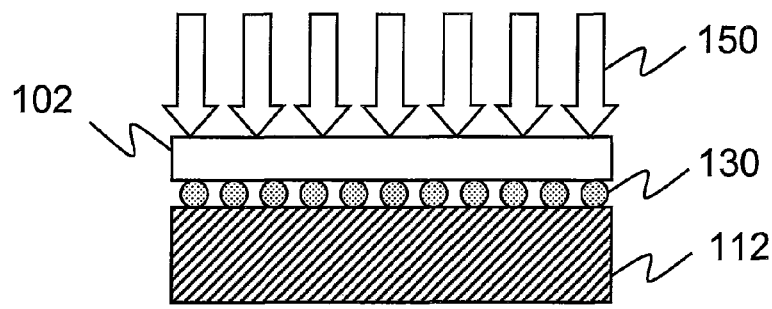

Then, the beam 150 with a specific wavelength is used to irradiate the nanoparticles 130 on the transparent substrate 102, the excited nanoparticles 130 can convert the light energy of the beam 150 into thermal energy, as shown in FIG. 6C. At this time, the beam with a specific wavelength irradiates the nanoparticles for a predetermined time. For example, the beam with a specific wavelength irradiates the nanoparticles for, but not limited to, about more than 5 seconds.

Figure 6D:
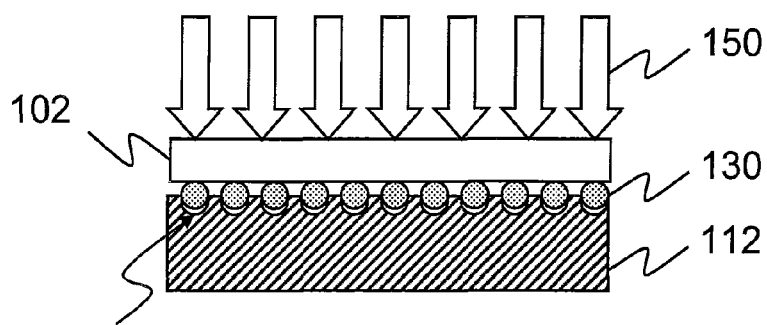

Then, the positions of pores 116 corresponding to the nanoparticles 130 are formed on the substrate 112 through the thermal energy generated by the nanoparticles 130 upon being irradiated by the beam, as shown in FIG. 6D.

Finally, the transparent substrate 102 is removed from the substrate 112, thereby obtaining the substrate 110 having the pores 116, as shown in FIG. 5E. Since the nanoparticles 130 are fixed on the transparent substrate 102, the nanoparticles 130 are removed together with the transparent substrate 102 when the transparent substrate 102 is removed. Furthermore, once the transparent substrate 102 is removed, the surface of the substrate 112 may be rinsed with a solution (for example, but not limited to, water or cleaning solution) or become clean by means of blowing, so as to eliminate the residual nanoparticle(s) 130 and/or impurities such as dusts adhered thereon, which facilitates the subsequent use or process.

Figure 7A:
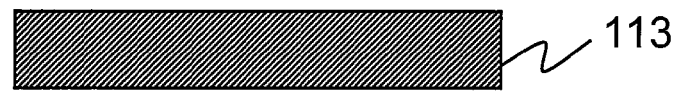
FIGS. 7A-7B are general flowcharts of an embodiment of forming a substrate in the method for manufacturing the substrate with the surface structure by employing photothermal effect according to the present invention.
Figure 7B:
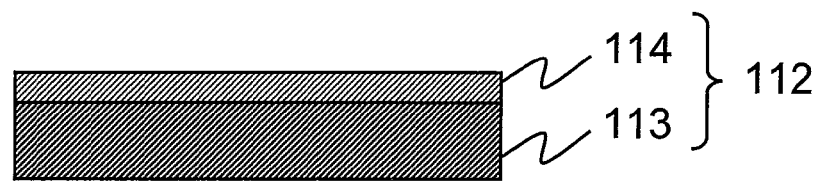
Figure 8:
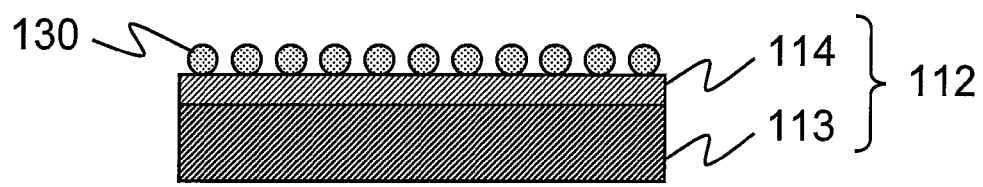
FIG. 8 is a schematic sectional view of an embodiment of distribution of nanoparticles in the method for manufacturing the substrate with the surface structure by employing photothermal effect according to the present invention.

The substrate 112 may be formed through the following steps. First, a sub-substrate 113 is provided, as shown in FIG. 7A. Next, a surface layer 114 with low melting point is formed on the sub-substrate 113 employing a material with a melting temperature lower than or equal to a temperature caused by the nanoparticles 130 duo to the thermal energy generated, as shown in FIG. 7B. At this time, the nanoparticles 130 are distributed on a surface of the surface layer 114, as shown in FIG. 8. The sub-substrate 113 may be made of organic material(s), inorganic material(s) (for example, glass, metal, and ceramic) or combination thereof. The surface layer 114 may be made of material(s) having a melting temperature lower than or equal to that of the thermal energy generated by the nanoparticles 130, i.e., lower than or equal to a temperature of the nanoparticles that is raised as the thermal energy is generated. The surface layer 114 may be made of organic material(s), inorganic material(s) or combination thereof, etc. The organic material may be, but not limited to, polyethylene, polystyrene, polyvinyl chloride, polyacetals, epoxy resin, polyamides, polyester, phenol formaldehyde, amino resin, but not limited to, polyurethane (PU), polymethylmethacrylate (PMMA) or polydimethylsiloxane (PDMS).

In other words, at least the material on the surface of the substrate 112 where it contacts with the nanoparticles 130 has a melting temperature lower than or equal to the temperature by the nanoparticles 130 due to thermal energy generated thereby. That is, the melting temperature at the surface of the substrate is lower than or equal to a temperature of the nanoparticles.

Example 1

Figure 9A:
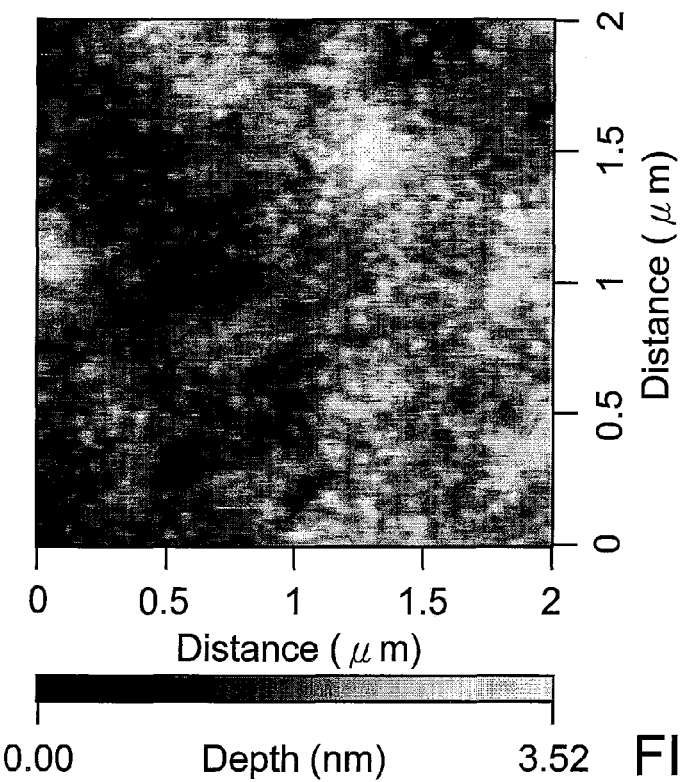
FIG. 9A is a micrograph view of a surface structure on a substrate observed with an atomic force microscopy (AFM) before being illuminated with laser in a first example according to the method for manufacturing the substrate with the surface structure by employing photothermal effect of the present invention.
Figure 9B:
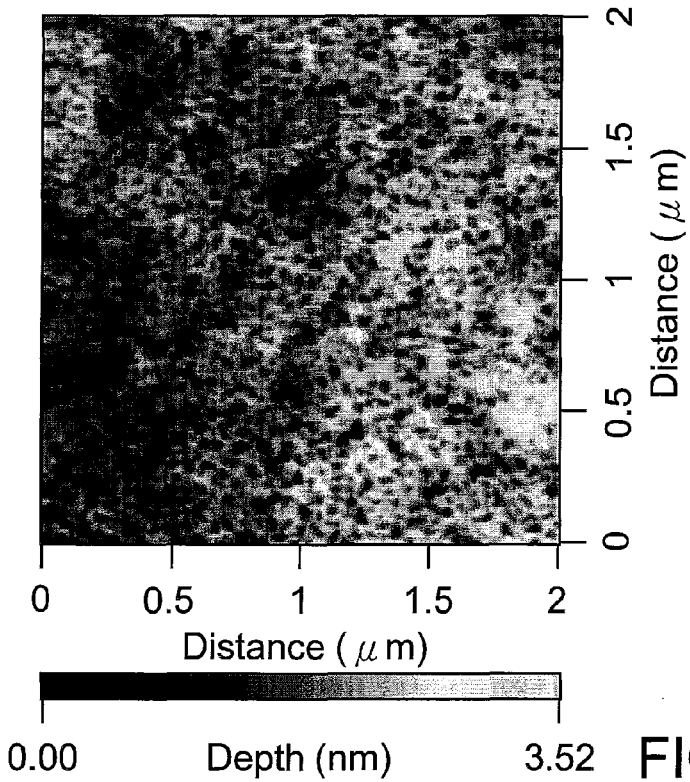
FIG. 9B is a micrograph view of a surface structure on a substrate observed with an AFM after being illuminated with laser in the first example manufactured according to the method for manufacturing the substrate with the surface structure by employing photothermal effect of the present invention.

The Au-nanoparticles (i.e., the nanoparticle was made of Au) with a particle size of about 20 nm were fixed on a transparent substrate, and then placed on a surface of a substrate made of a polymer material. The Au-nanoparticles closely contacted the surface of the substrate. Then, the green laser with a wavelength of 532 nm was used to irradiate the transparent substrate with Au-nanoparticles for about 15 seconds. The Au-nanoparticles were excited on the substrate. At this time, the Au-nanoparticles generated temperature of up to 200° C. within 15 seconds upon being irradiated by the green laser. After exposed time, i.e. the time of irradiation, of 15 seconds, the transparent substrate and the Au-nanoparticles were removed from the substrate to obtain the substrate with pores. Before being irradiated by the green laser, the surface of the substrate having the Au-nanoparticles was observed with an atomic force microcopy (AFM), as shown in FIG. 9A. After being irradiated by the green laser, the obtained substrate with the pores was also observed by the AFM, as shown in FIG. 9B. Furthermore, as seen from FIGS. 9A and 9B that, many pores was formed on the surface of the substrate obtained according to the method for manufacturing a substrate with surface structure by employing photothermal effect of the present invention.

Figure 10A:
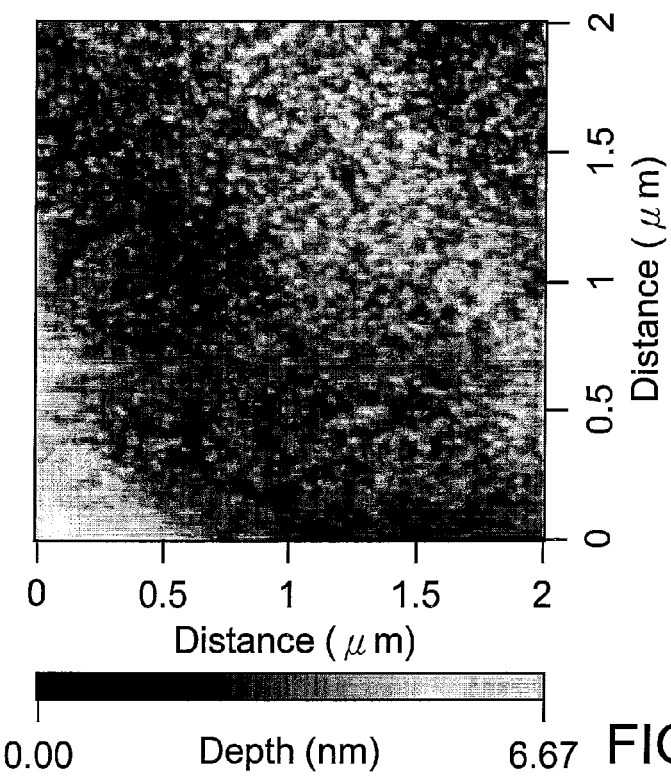
FIG. 10A is a micrograph view of a surface structure on a substrate observed with an AFM before nanoparticles are distributed in the substrate 1 in the first example according to the method for manufacturing the substrate with the surface structure by employing photothermal effect of the present invention.
Figure 10B:
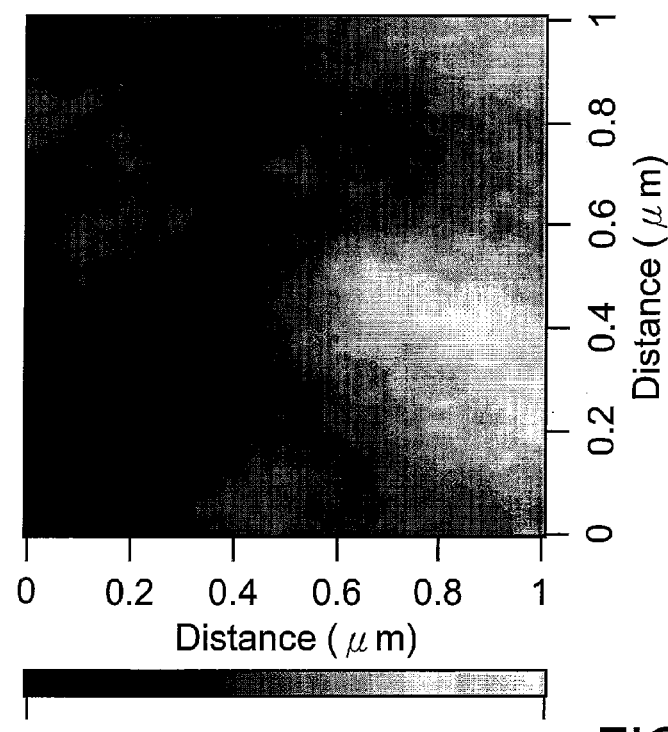
FIG. 10B is a micrograph view of a surface structure on a substrate observed with an AFM before nanoparticles are distributed in the substrate 2 in the first example according to the method for manufacturing substrate with the surface structure by employing photothermal effect of the present invention.
Figure 10C:
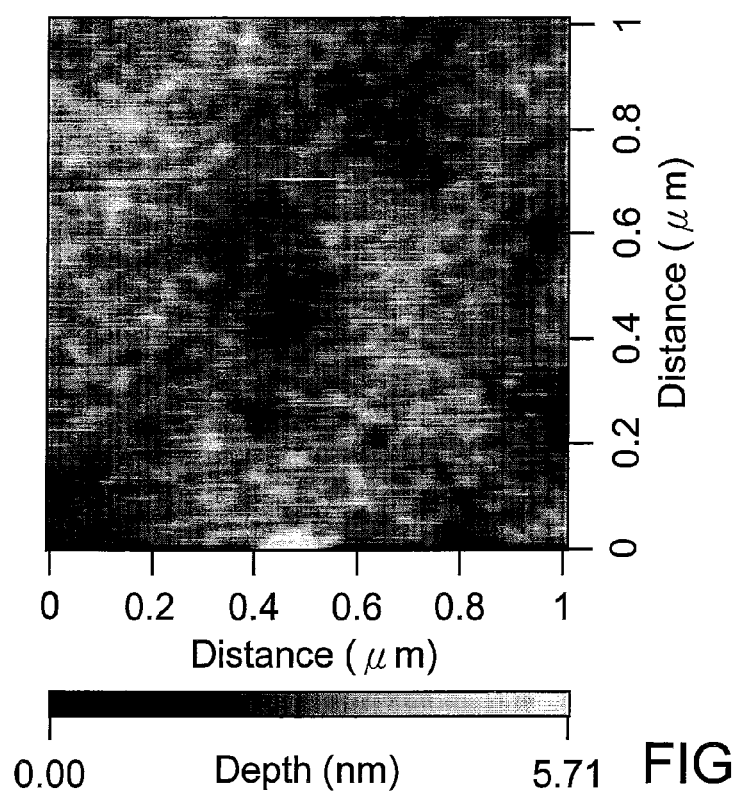
FIG. 10C is a micrograph view of a surface structure on a substrate observed with an AFM before nanoparticles are distributed in the substrate 3 in the first example according to the method for manufacturing the substrate with the surface structure by employing photothermal effect of the present invention.

Furthermore, three types of substrates were provided. In order to illustrate conveniently, they are respectively referred as the substrate 1, the substrate 2, and the substrate 3 hereinafter. The substrate 1 was formed by a sub-substrate made of glass and a surface layer with low melting point made of PU. The substrate 2 was formed by a sub-substrate made of glass and a surface layer with low melting point made of PMMA/ethanol. The substrate 3 was formed by a sub-substrate made of glass and a surface layer with low melting point made of PDMS. First, the surfaces of the surface layers with low melting point opposite to the sub-substrates of the substrates 1, 2, and 3 were observed with the AFM, as shown in FIGS. 10A, 10B, and 10C, respectively.

Herein, the Au-nanoparticles with a particle size of about 20 nm were fixed on the transparent substrate, and then the transparent substrate was placed on the substrate. Herein, the Au-nanoparticles closely contacted surface of the surface layer with low melting point. Then, three types of the substrates having pores were manufactured according to the following parameters (in order to illustrate conveniently, they are respectively referred as the substrate 1', the substrate 2', and the substrate 3' hereinafter), and these substrates were respectively observed with the AFM.

Example 2

Figure 11A:
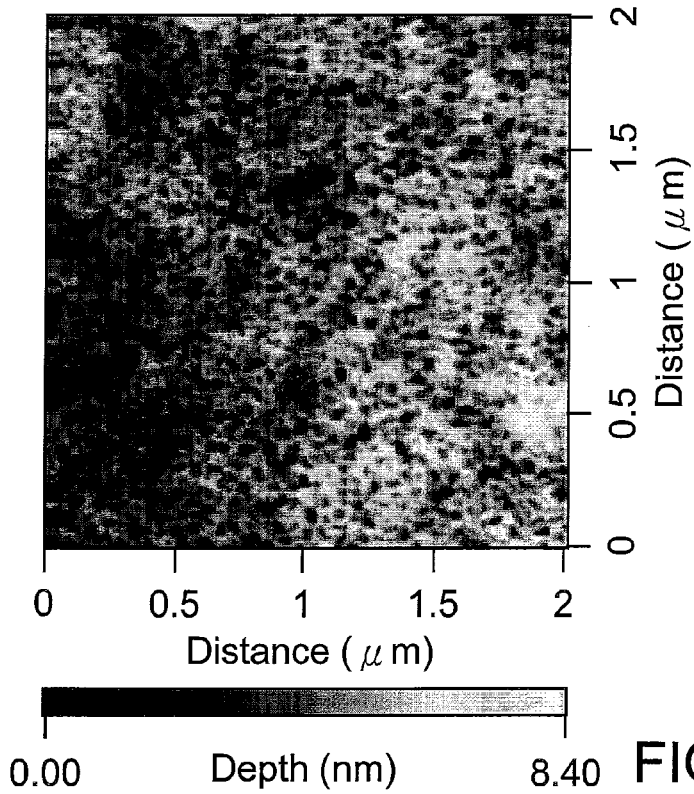
FIG. 11A is a micrograph view of a surface structure on a substrate observed with an AFM before being illuminated with laser in a second example according to the method for manufacturing the substrate with the surface structure by employing photothermal effect of the present invention.
Figure 11B:
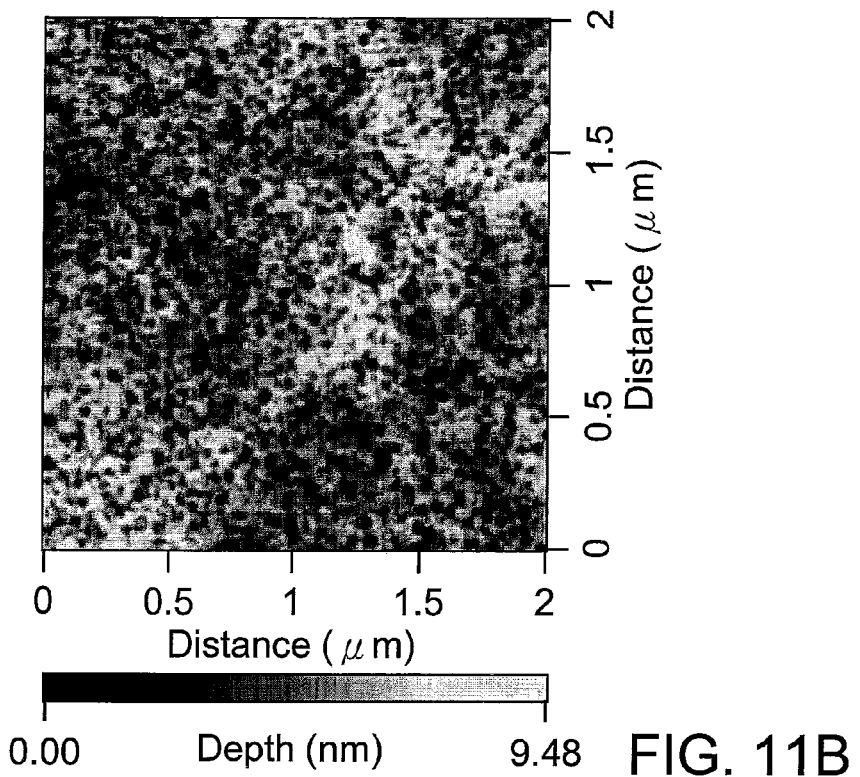
FIG. 11B is a micrograph view of a surface structure on a substrate observed with an AFM after being illuminated with laser in the second example according to the method for manufacturing the substrate with the surface structure by employing photothermal effect of the present invention.

The green laser with a wavelength of 532 nm and a power of 100 mW was used to irradiate the Au-nanoparticles where was placed on the substrate 1 through the transparent substrate for about 10 minutes. Once the irradiation was completed, the transparent substrate and Au-nanoparticles were removed, so as to obtain the substrate 1'. Before being irradiated by the green laser, the substrate having the Au-nanoparticles was observed with an AFM, as shown in FIG. 11A. After being irradiated by the green laser, the substrate 1' obtained was observed with an AFM, as shown in FIG. 11B.

Example 3

Figure 12A:
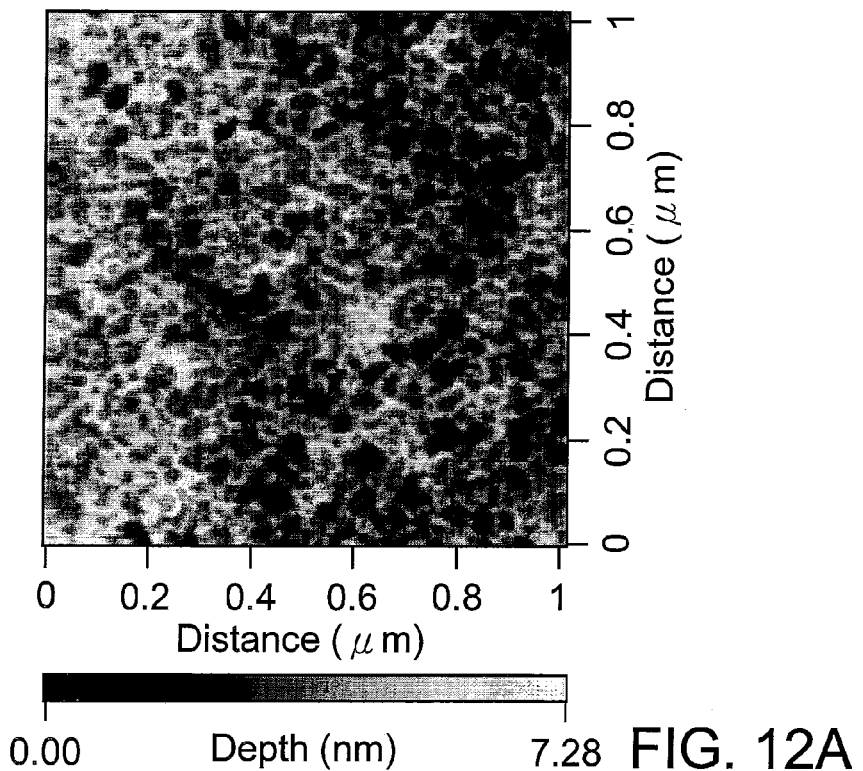
FIG. 12A is a micrograph view of a surface structure on a substrate observed with an AFM before being illuminated with laser in a third example according to the method for manufacturing the substrate with the surface structure by employing photothermal effect of the present invention.
Figure 12B:
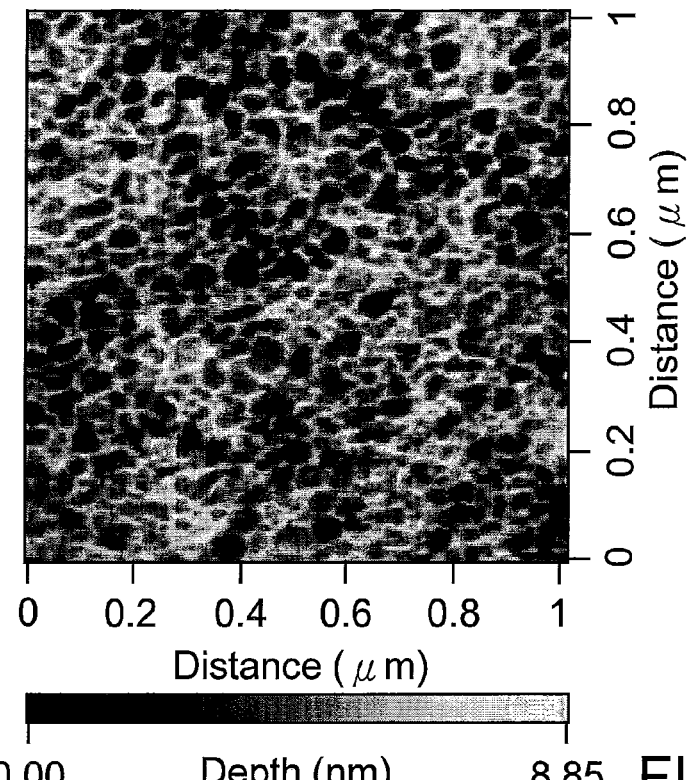
FIG. 12B is a micrograph view of a surface structure on a substrate observed with an AFM after being illuminated with laser in the third example according to the method for manufacturing the substrate with the surface structure by employing photothermal effect of the present invention.

The green laser with a wavelength of 514.5 nm and a power of 1 W irradiated the Au-nanoparticles placed on the substrate 2 through the transparent substrate for about 20 minutes. Once the irradiation was completed, the transparent substrate and Au-nanoparticles were removed, so as to obtain the substrate 2'. Before being irradiated by the green laser, the substrate having the Au-nanoparticles was observed with an AFM, as shown in FIG. 12A. After being irradiated by the green laser, the obtained substrate 2' was observed with an AFM, as shown in FIG. 12B.

Example 4

Figure 13A:
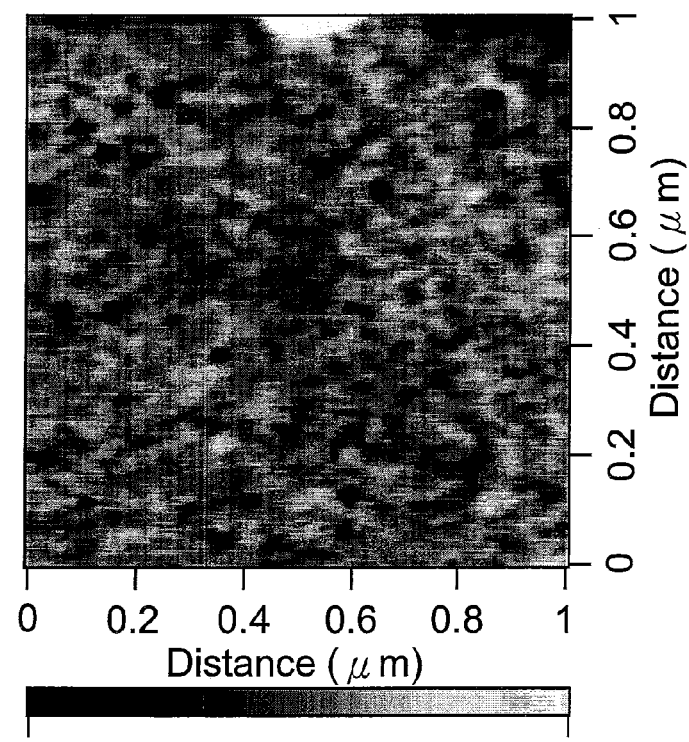
FIG. 13A is a micrograph view of a surface structure on a substrate observed with an AFM before being illuminated with laser in a fourth example according to the method for manufacturing the substrate with the surface structure by employing photothermal effect of the present invention.
Figure 13B:
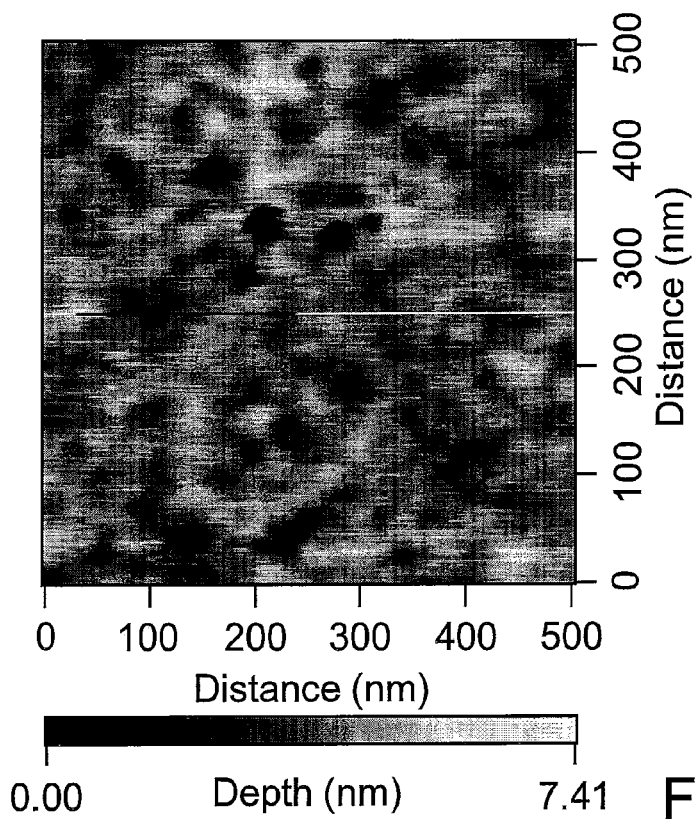
FIG. 13B is a micrograph view of a surface structure on a substrate observed with an AFM after being illuminated with laser in the fourth example according to the method for manufacturing the substrate with the surface structure by employing photothermal effect of the present invention.

The green laser with a wavelength of 514.5 nm and a power of 2 W irradiated the Au-nanoparticles placed on the substrate 3 through the transparent substrate for about 40 minutes. Once the irradiation was completed, the transparent substrate and Au-nanoparticles were removed, so as to obtain the substrate 3'. Before being irradiated by the green laser, the substrate having the Au-nanoparticles was observed with an AFM, as shown in FIG. 13A. After being irradiated by the green laser, the obtained substrate 3' was observed with an AFM, as shown in FIG. 13B.

Furthermore, the Au-nanoparticles with a particle size of about 60 nm were fixed on the transparent substrate, and then the transparent substrate was placed on the surface of the surface layer with low melting point of the substrate to enable the Au-nanoparticles to closely contact the substrate. Then, two types of the substrates having pores were manufactured which according to the following parameters (in order to illustrate conveniently, they are respectively called the substrate 4' and the substrate 5' hereinafter), and then the manufactured substrates were observed with the AFM.

Example 5

Figure 14A:
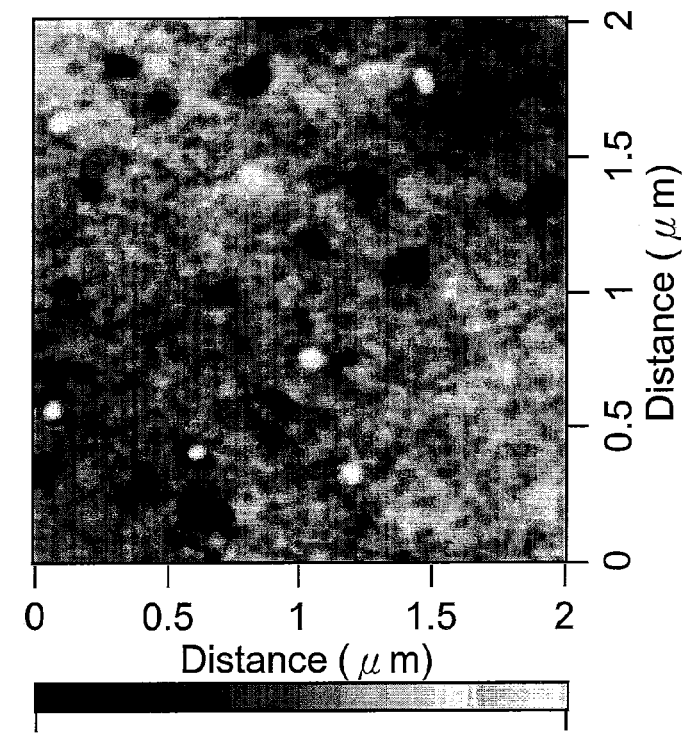
FIG. 14A is a micrograph view of a surface structure on a substrate observed with an AFM before being illuminated with laser in structure on a fifth example according to the method for manufacturing the substrate with the surface structure by employing photothermal effect of the present invention.
Figure 14B:
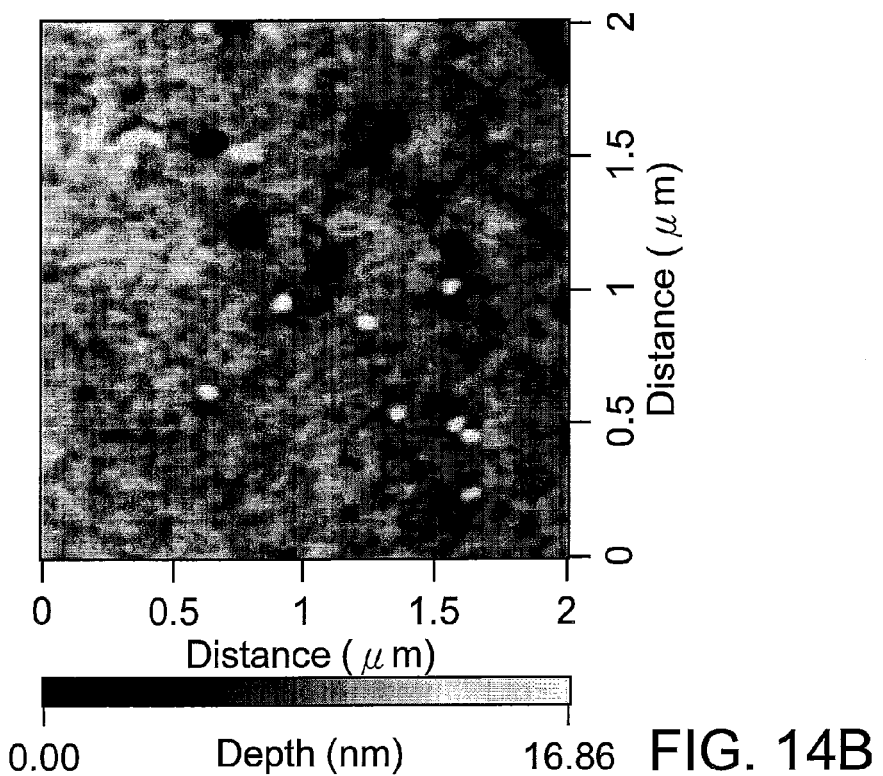
FIG. 14B is a micrograph view of a surface structure on a substrate observed with an AFM after being illuminated with laser in the fifth example according to the method for manufacturing the substrate with the surface structure by employing photothermal effect of the present invention.

The green laser with a wavelength of 514.5 nm and a power of 2 W irradiated the Au-nanoparticles placed on the substrate 1 through the transparent substrate for about 40 minutes. Once the irradiation was completed, the transparent substrate and Au-nanoparticles were removed, so as to obtain the substrate 4'. Before being irradiated by the green laser, the substrate having the Au-nanoparticles was observed with an AFM, as shown in FIG. 14A. After being irradiated by the green laser, the obtained substrate 4' was observed with an AFM, as shown in FIG. 14B.

Example 6

Figure 15A:
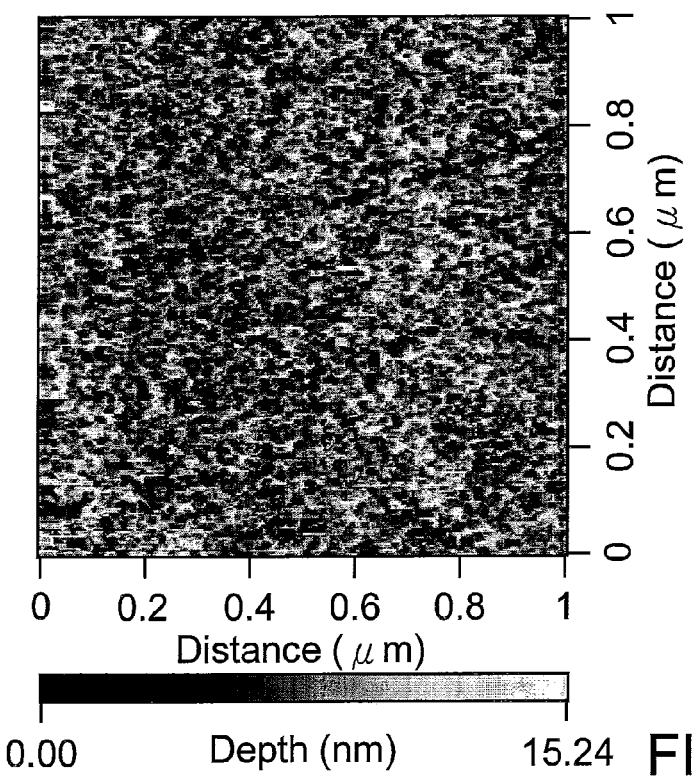
FIG. 15A is a micrograph view of a surface structure on a substrate observed with an AFM before being illuminated with laser in a sixth example according to the method for manufacturing the substrate with the surface structure on substrate by employing photothermal effect of the present invention.
Figure 15B:
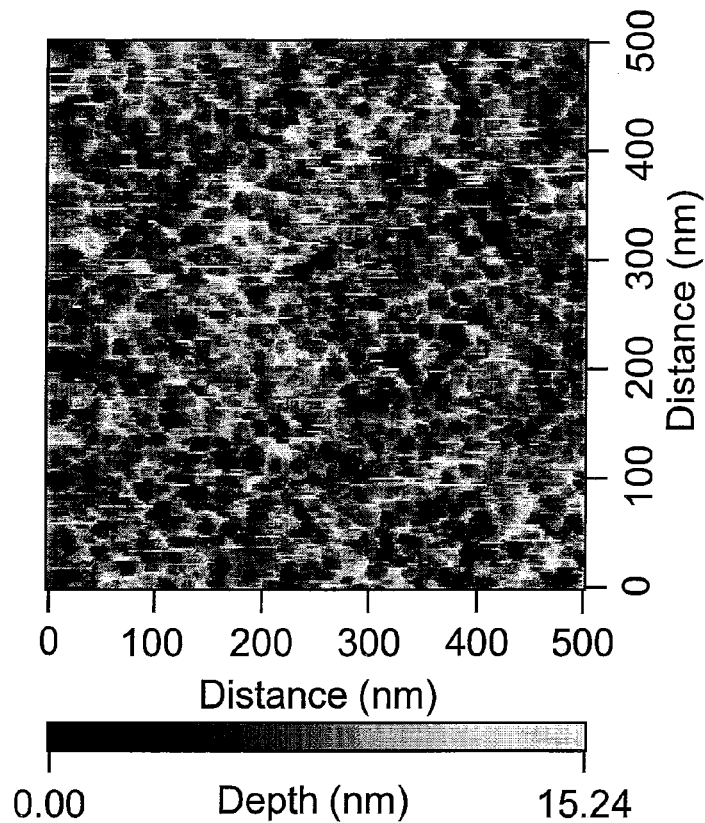
FIG. 15B is a micrograph view of a surface structure on a substrate observed with an AFM after being illuminated with laser in the sixth example according to the method for manufacturing the substrate with the surface structure by employing photothermal effect of the present invention.

The green laser with a wavelength of 514.5 nm and a power of 2 W irradiated the Au-nanoparticles placed on the substrate 3 through the transparent substrate for about 40 minutes. Once the irradiation was completed, the transparent substrate and Au-nanoparticles were removed, so as to obtain the substrate 5'. Before being irradiated by the green laser, the substrate having the Au-nanoparticles was observed with an AFM, as shown in FIG. 15A. After being irradiated by the green laser, the obtained substrate 5' was observed with an AFM, as shown in FIG. 15B.

Referring to FIGS. 16A-16D, they show a method for manufacturing a substrate with surface structure by employing photothermal effect according to an embodiment of the present invention.

Figure 16A:
FIGS. 16A-16D are general flowcharts of the method for manufacturing structure on substrate by employing photothermal effect according to a fourth embodiment of the present invention.

First, a substrate 112 is provided, as shown in FIG. 16A.

Figure 16B:
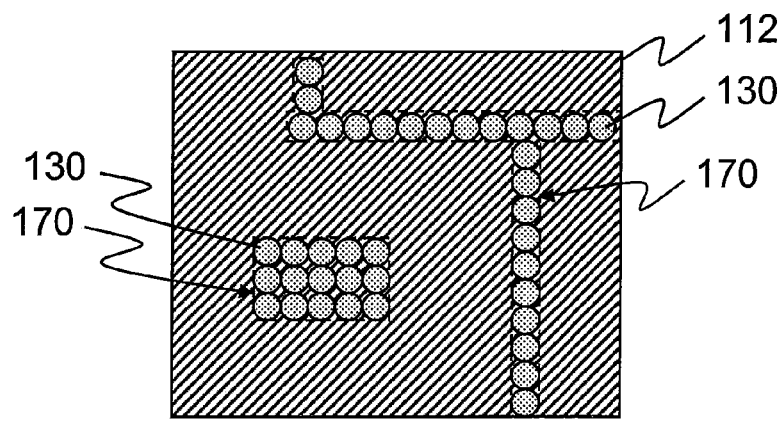

Next, a plurality of nanoparticles 130 is distributed on the substrate 112 in accordance with at least one predetermined pattern 170, as shown in FIG. 16B. These nanoparticles 130 used to be distributed on the provided substrate can have the same particle size, or have two or more particle sizes. These nanoparticles 130 used to be distributed on the provided substrate can have the same material, or have two or more materials. These nanoparticles 130 used to be distributed on the provided substrate can have the same shape, or have two or more shapes.

Moreover, a way, such as, but not limited to, spray printing, spin coating, coating, and covalent bonding, etc., can be used to fix the nanoparticles 130 on the substrate 112. The way to fix the nanoparticles 130 on the substrate 112 can be selected from a physical way and a chemical way according to the property of the material of the substrate 112. The physical way can be, for example, a plasma treat. Under the plasma treat, electron is gun to the surface of the substrate to rough the surface of the substrate, such that the nanoparticles can be fixed on the rough surface of the substrate. The chemical way can be, for example, forming a self-assembly monolayer in the surface of the substrate or surface modification. Under the way of forming the self-assembly monolayer in the surface of the substrate, the self-assembly monolayer of the predetermined pattern 170 is formed in the surface of the substrate, such that the nanoparticles can be fixed on the self-assembly monolayer of the predetermined pattern 170. Under the surface modification, the surfaces of the nanoparticles 130 are modified or a portion of surface, i.e. surface to be formed the layer of the predetermined pattern 170, of the substrate is modified, such that the nanoparticles 130 can be fixed on the surface of the substrate via the modified surface in chemical bonding, such as ion bonding, covalent bonding, etc., manner. The surface is treated with surface modification to form function groups thereon. The function groups can be, but not limited to, N-hydroxy succinimide (NHS) groups, amino groups, aldehyde groups, epoxy groups, carboxyl groups, hydroxyl groups, acyl groups, acetyl groups, hydrazonos, hydrophobic groups, thiol groups, photoreactive groups, cysteine groups, disulfide groups, alkyl halide groups, acyl halide groups, azide groups, phosphate groups, or their combination, etc.

Figure 16C:
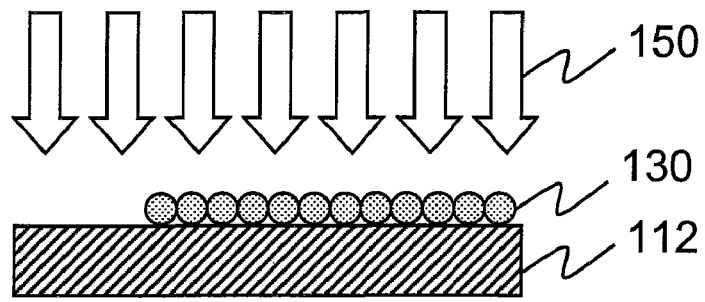

Then, the beam 150 with a specific wavelength irradiates the nanoparticles 130 on the substrate 112, so as to excite the nanoparticles 130 to convert the light energy of the light 150 into thermal energy, as shown in FIG. 16C. At this time, the beam continuously irradiates the nanoparticles for a predetermined time. For example, the beam with a specific wavelength can irradiate the nanoparticles for, but not limited to, about more than 5 seconds.

Figure 16D:
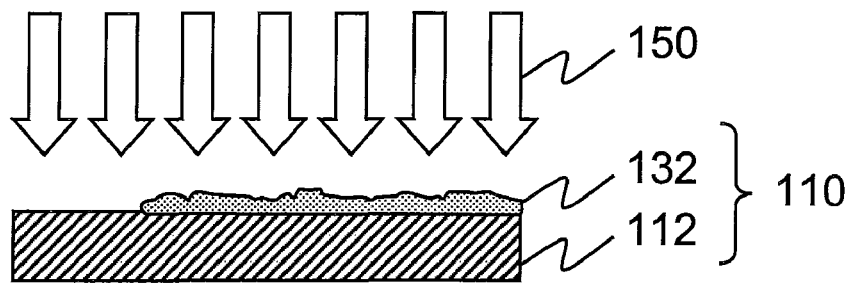
Figure 17:
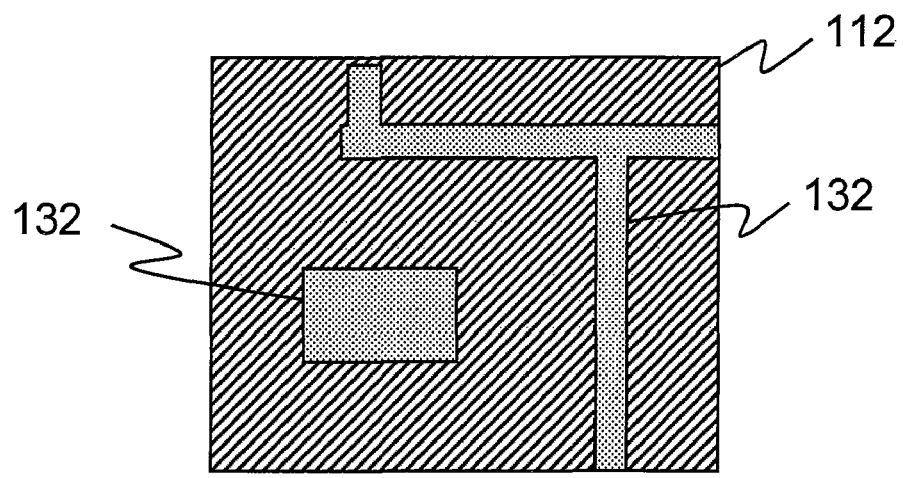
FIG. 17 is a schematic top view corresponding to FIG. 16D.

The nanoparticles on the substrate 112 are melted under the thermal energy generated by the nanoparticles 130 to form a nanoparticle-melted thin layer of the predetermined pattern 170, thereby obtaining the substrate 110 with the layer of the predetermined pattern, as shown in FIGS. 16D and 17.

The nanoparticles 130 may be formed by a metal material (i.e., metal nanoparticles). At this time, the melted nanoparticles 132, i.e. the nanoparticle-melted thin layer of the predetermined pattern, can serve as one or more conductive wires and/or one or more conductive areas. That is, the nanoparticle-melted thin layer may be a conductive layer of a pattern of one or more conductive wires and/or one or more conductive areas.

Furthermore, if the material of the substrate is appropriately selected, the obtained substrate having one or more conductive wires and/or one or more conductive areas can serve as a circuit board. In other words, the material of the nanoparticles has a melting temperature lower than or equal to the generated thermal energy, i.e. a temperature caused by the nanoparticles due to the generated thermal energy. The conductive area can be, for example, a ground.

Furthermore, the obtained substrate may be cleaned firstly before the subsequent use or processes, so as to remove those unfixed nanoparticles, unfixed but melted nanoparticles, and/or impurities on the surface of the obtained substrate. Particularly, the obtained substrate may be rinsed with a solution (for example, but not limited to, water or a cleaning solution) or become clean by means of blowing.

Example 7

Figure 18A:
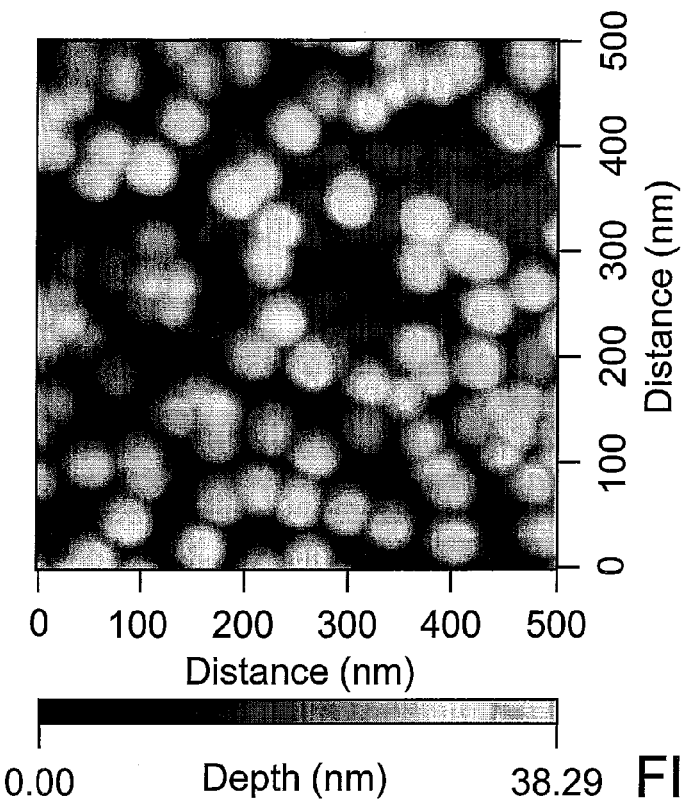
FIG. 18A is a micrograph view of a surface structure on a substrate observed with an AFM before being illuminated with laser in a seventh example according to the method for manufacturing the substrate with the surface structure by employing photothermal effect of the present invention.
Figure 18B:
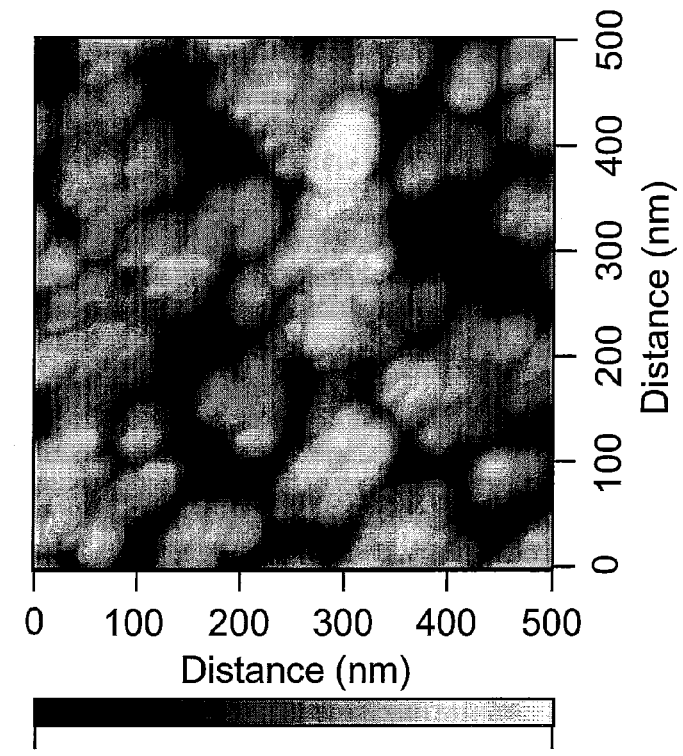
FIG. 18B is a micrograph view of a surface structure on a substrate observed with an AFM after being illuminated with laser in the seventh example according to the method for manufacturing the substrate with the surface structure by employing photothermal effect of the present invention.

The Au-nanoparticles with a particle size of about 20 nm were distributed on the substrate made of, but not limited to, an organic material in accordance with the predetermined pattern. Then, the green laser with a wavelength of 532 nm irradiated the Au-nanoparticles on the substrate for about 15 seconds. At this time, the Au-nanoparticles could generate the thermal energy with a temperature of up to 200° C. within 15 seconds upon being irradiated by the green laser, so that the surfaces of the Au-nanoparticles were melted with each other and fixed on the substrate. Once the irradiation of the green laser was completed, the substrate with the predetermined pattern was obtained. Before being irradiated by the green laser, the surface of the substrate having the Au-nanoparticles was observed with the AFM, as shown in FIG. 18A. After being irradiated by the green laser, the obtained substrate was observed with the AFM, as shown in FIG. 18B. Referring to FIGS. 18A and 18B, the nanoparticles on the surface of the obtained substrate had already been melted together.

Figure 19A:
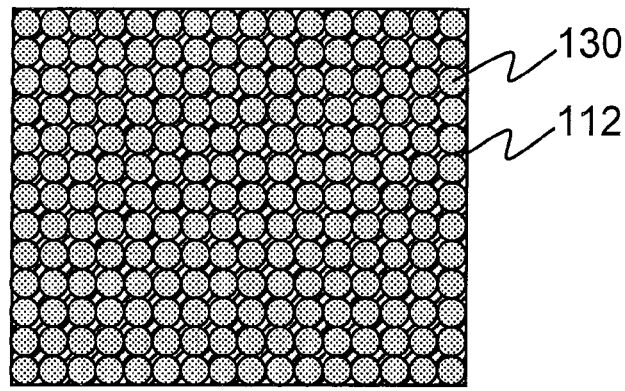
FIGS. 19A-19D are general flowcharts of the method for manufacturing the substrate with the surface structure by employing photothermal effect according to a fifth embodiment of the present invention.

In another embodiment, a layer of nanoparticles 130, e.g. a whole layer of nanoparticles, is distributed on a surface of the substrate 112 where a surface structure is to be formed, as shown in FIG. 19A. These nanoparticles 130 used to be distributed on the provided substrate can have the same particle size, or have two or more particle sizes. These nanoparticles 130 used to be distributed on the provided substrate can have the same material, or have two or more materials. These nanoparticles 130 used to be distributed on the provided substrate can have the same shape, or have two or more shapes. Moreover, the nanoparticles 130 may be distributed on the substrate 112 by means of, but not limited to, spray printing, spin coating, and coating, etc. Furthermore, the nanoparticles 130 may be distributed on the surface of the substrate 112 in a state of a solution.

Figure 19B:
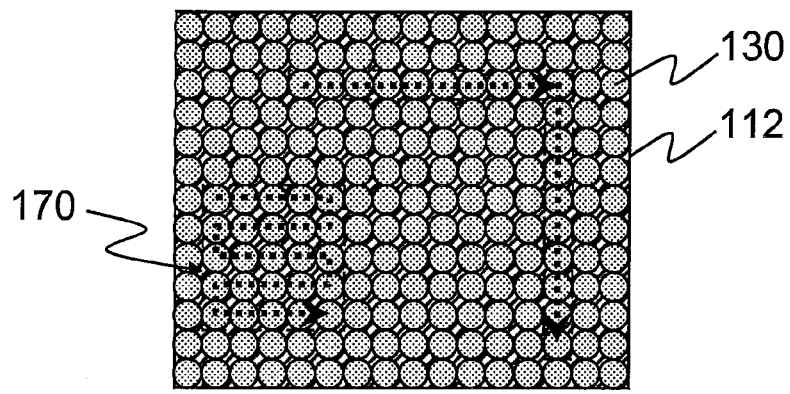
Figure 20:
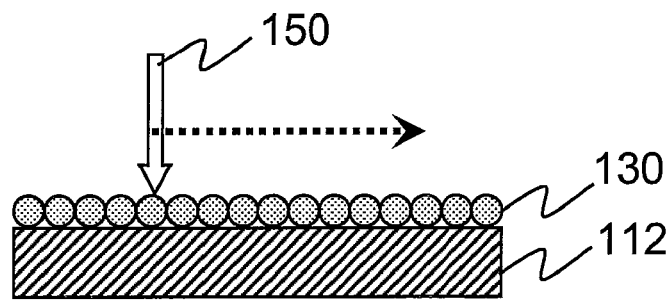
FIG. 20 is a general sectional view corresponding to FIG. 19B.

Then, the beam 150 in a specific wavelength irradiates the nanoparticles 130 on the substrate 112, and meanwhile, the light source for emitting the beam 150 is moved according to the predetermined pattern to be formed, so that the beam 150 travel above the nanoparticles 130 to excite the nanoparticles 130 at positions where the predetermined pattern is to be formed, as shown in FIGS. 19B and 20. The beam can continuously irradiate the nanoparticles for a predetermined time. For example, the beam with a specific wavelength can irradiate the nanoparticles for, but not limited to, about more than 5 seconds.

Figure 19C:
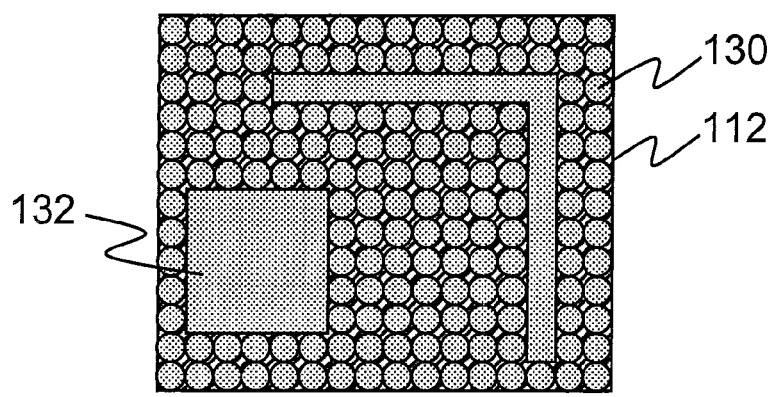
Figure 21:
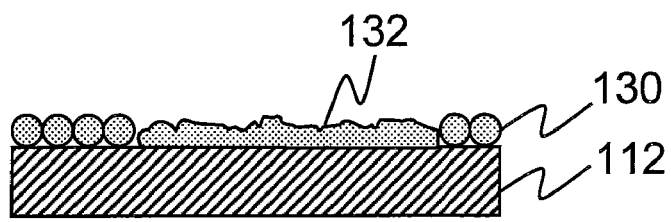
FIG. 21 is a general sectional view corresponding to FIG. 19C.

The excited nanoparticles 130 convert the light energy of the beam 150 into thermal energy. Then, the excited nanoparticles 130 are melted together with those nanoparticles 130 there-around on the substrate 112 under the thermal energy generated by the excited nanoparticles 130, and then fixed on the substrate 112, as shown in FIGS. 19C and 21. In other words, the excited nanoparticles 130 and those nanoparticles 130 there-around are melted together on the surface, that is, the substrate 112 not only has non-melted nanoparticles 130, but also has melted nanoparticles 132.

Figure 19D:
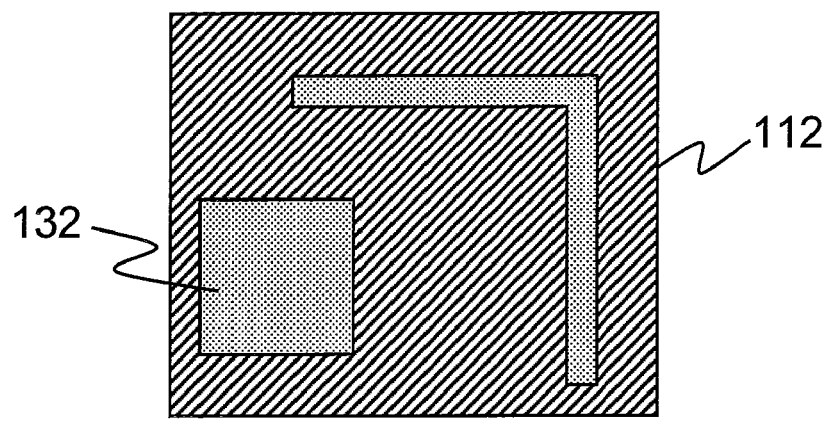

Finally, the nanoparticles 130 not melted together with those nanoparticles 130 there-around are removed from the surface, so as to form a nanoparticle-melted thin layer of the predetermined pattern 170, i.e., obtaining the substrate 110 with the layer of the predetermined pattern, as shown in FIG. 19D. In other words, once the non-melted nanoparticles 130 are removed, merely the melted nanoparticles 132 are left on the surface of the substrate 112, such that the predetermined pattern is presented. At this time, the non-melted nanoparticles 130 may be rinsed with a solution (for example, but not limited to, water or a cleaning solution) or blown off, so as to be removed from the substrate 112.

The nanoparticles 130 may be made of a metal material. At this time, the melted nanoparticles 132 left on the surface of the substrate 112 can serve as one or more conductive wires and/or one or more conductive areas. That is, the nanoparticle-melted thin layer can be a conductive layer of the pattern of the conductive wires and/or the conductive areas. Therefore, the substrate with the conductive wires and/or the conductive areas may be obtained.

For example, when the surface structure (i.e., the layer of the predetermined pattern) to be formed is a conductive layer with the pattern of conductive wires, the beam move correspondingly to positions where the conductive wires are to be formed, so as to excite the nanoparticles at the positions on the substrate where the conductive wires are to be formed, and thus the nanoparticles are melt with each other and then fixed on the substrate. Once the non-melted nanoparticles are removed from the substrate, the melted nanoparticles (i.e., the nanoparticle-melted thin layer of the predetermined pattern) in the configuration of conductive wires are left on the substrate, thereby obtaining the substrate with the layer of the predetermined pattern, which has the substrate and the melted nanoparticles.

Likewise, when the surface structure (i.e., the layer of the predetermined pattern) to be formed is a conductive layer with the pattern of at least one conductive area, the beam move correspondingly to positions where the conductive area is to be formed, so as to excite the nanoparticles at the positions on the substrate where the conductive area is to be formed, such that the nanoparticles are melt with each other and then fixed on the substrate. After the non-melted nanoparticles are removed from the substrate, the melted nanoparticles (i.e., the nanoparticle-melted thin layer of the predetermined pattern) in the configuration of the conductive area are left on the substrate, thereby obtaining the substrate with a conductive layer of the predetermined pattern, which is formed by the substrate and the melted nanoparticles.

Furthermore, if the material of the substrate is appropriately selected, the obtained substrate having one or more conductive wires or one or more conductive areas can serve as a circuit board. In this case, the material of the nanoparticles has a melting temperature lower than or equal to the generated thermal energy, i.e. a temperature caused by the nanoparticles due to the generated thermal energy.

Examples 8, 9, and 10

Figure 22A:
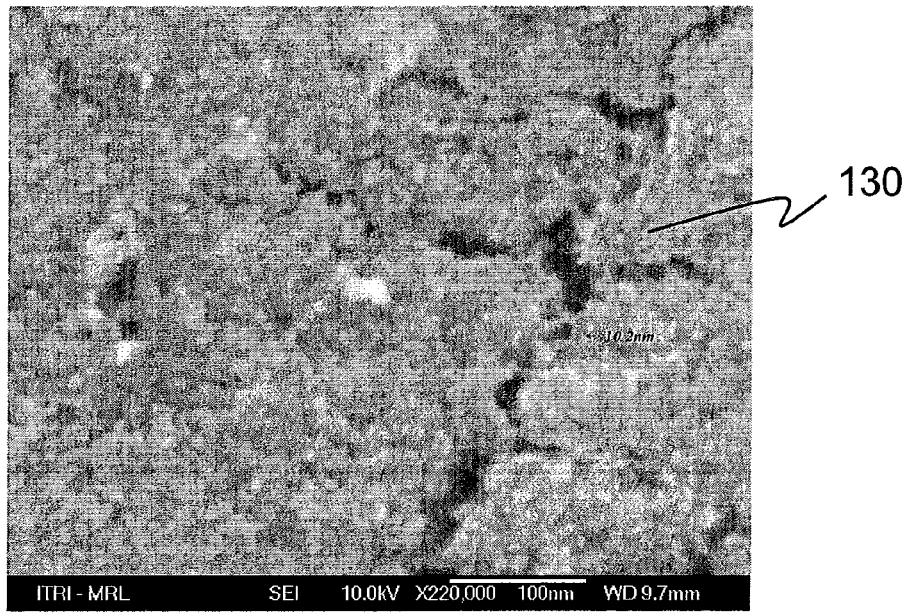
FIG. 22A is a micrograph view of a surface structure on a substrate observed with an electron microscope before being illuminated with laser in eighth, ninth, and tenth examples according to the method for manufacturing the substrate with the surface structure by employing photothermal effect of the present invention.
Figure 22B:
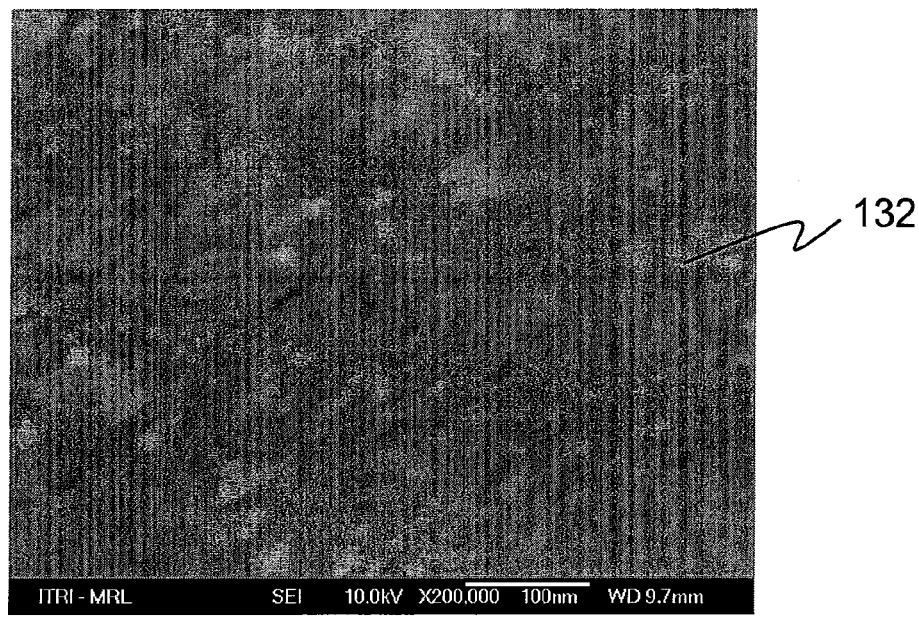
FIG. 22B is a micrograph view of a surface structure on a substrate observed with an electron microscope after being illuminated with laser of 1.8 W in the eighth example according to the method for manufacturing the substrate with the surface structure by employing photothermal effect of the present invention.
Figure 22C:
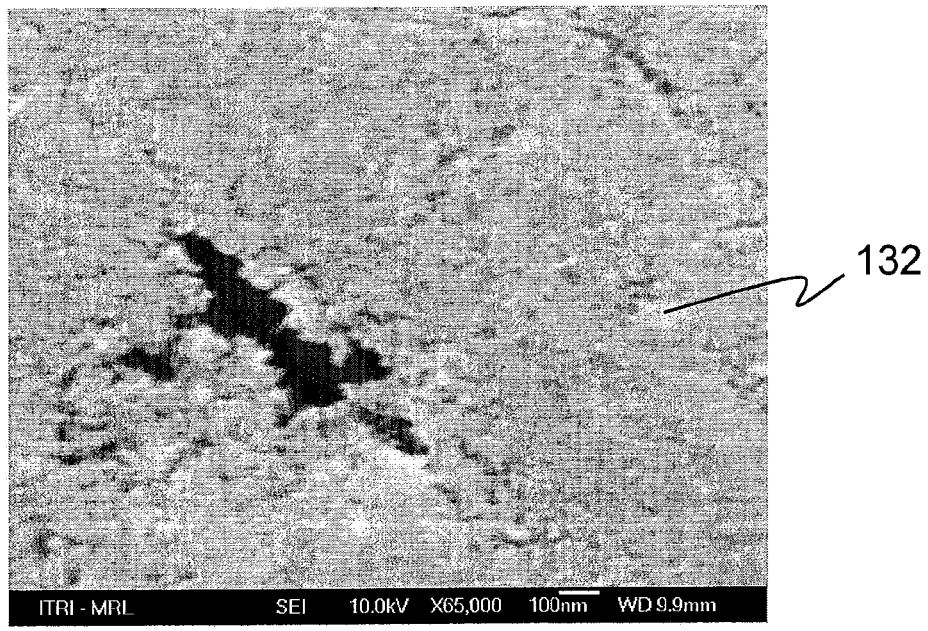
FIG. 22C is a micrograph view of a surface structure on a substrate observed with an electron microscope after being illuminated with laser of 1.5 W in the ninth example according to the method for manufacturing the substrate with the surface structure by employing photothermal effect of the present invention.
Figure 22D:
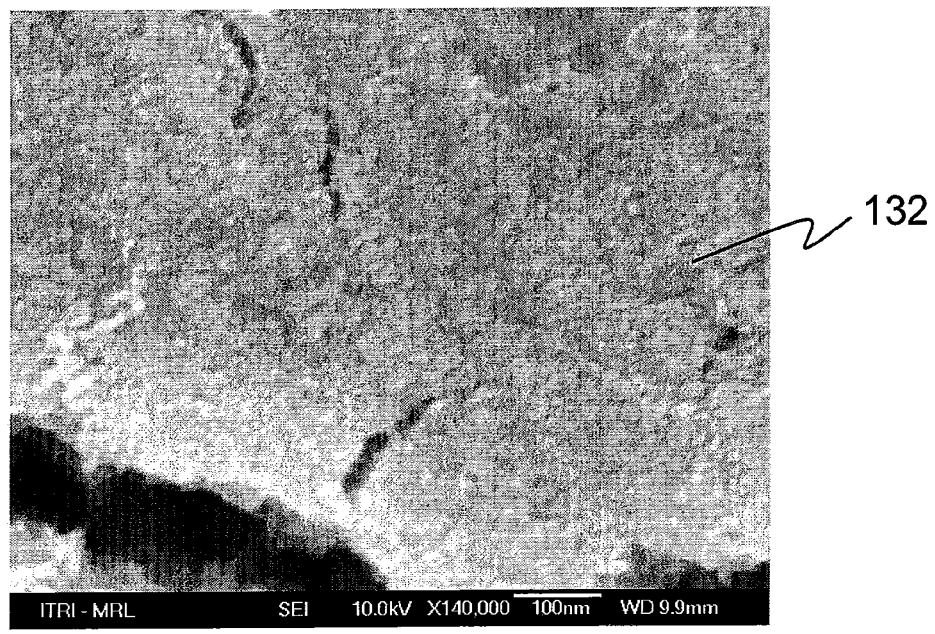
FIG. 22D is a micrograph view of a surface structure on a substrate observed with an electron microscope after being illuminated with laser of 1.2 W in the tenth example according to the method for manufacturing the substrate with the surface structure by employing photothermal effect of the present invention.

The Au-nanoparticles in a state of a solution with a particle size of about 8 nm to 9 nm were coated on a substrate made of glass. Then, the green laser (with a wavelength of 514 nm) with different powers irradiated the Au-nanoparticles on the substrate to excite the Au-nanoparticles with irradiation rate 1.25 mm/sec, such that the excited Au-nanoparticles were melted with those Au-nanoparticles there-around. In terms of a conductivity test, after being irradiated by the laser of 1.8 W, the conductivity of the melted Au-nanoparticles on the surface of the substrate was about 1.55 Ω/sq; after being irradiated by the laser of 1.5 W, the conductivity of the melted Au-nanoparticles on the surface of the substrate was about 5.21 Ω/sq; and after being irradiated with the laser of 1.2 W, the conductivity of the melted Au-nanoparticles on the surface of the substrate was about 9.02 Ω/sq. Furthermore, before being irradiated by the laser, a secondary electron image (SEI) of the substrate with the Au-nanoparticles 130 formed on the surface thereof was observed with an electron microscope at the magnification of 220,000 and the working distance of 9.7 mm, as shown in FIG. 22A. After being irradiated by the laser of 1.8 W, the SEI of the substrate with melted Au-nanoparticles 132 on the surface thereof was observed with the electron microscope at the magnification of 200,000 and the working distance of 9.7 mm, as shown in FIG. 22B. After being irradiated by the laser of 1.5 W, the SEI of the substrate with melted Au-nanoparticles 132 on the surface thereof was observed with the electron microscope at the magnification of 65,000 and the working distance of 9.7 mm, as shown in FIG. 22C. After being irradiated by the laser of 1.2 W, the SEI of the substrate with melted Au-nanoparticles 132 on the surface thereof was observed with an electron microscope at the magnification of 140,000 and the working distance of 9.7 mm, as shown in FIG. 22D. Therefore, referring to FIGS. 22A-22D, as for the substrate obtained according to the method for manufacturing a substrate with surface structure by employing photothermal effect of the present invention, the nanoparticles on the surface of the obtained substrate had been melted together, and the melted nanoparticles had a desirable conductivity.

Example 11

Figure 23A:
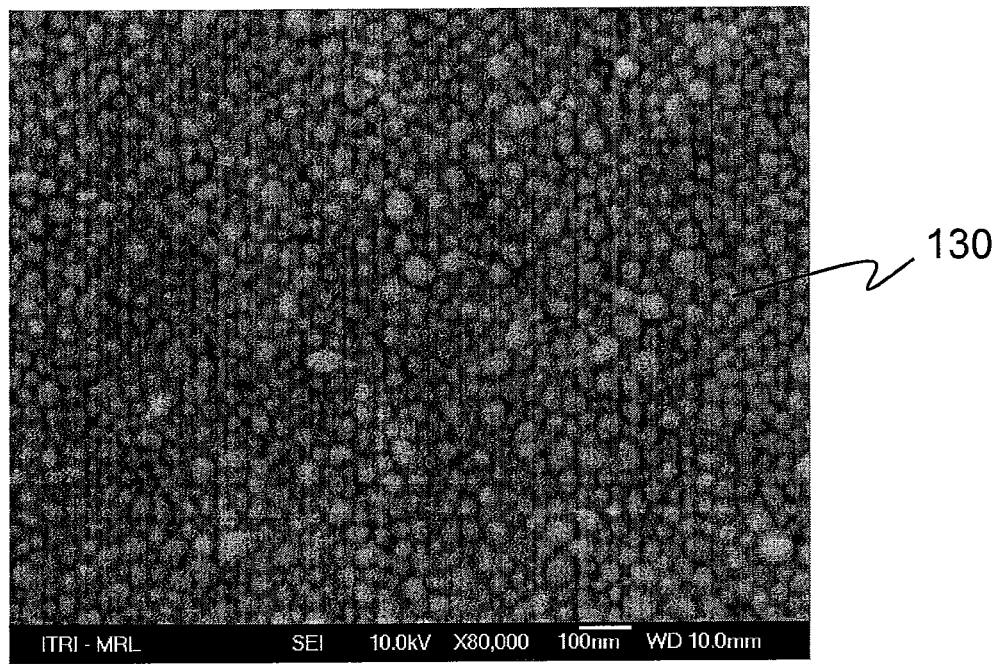
FIG. 23A is a micrograph view of a surface structure on a substrate observed with an electron microscope before being annealed in a eleventh example according to the method for manufacturing the substrate with the surface structure by employing photothermal effect of the present invention.
Figure 23B:
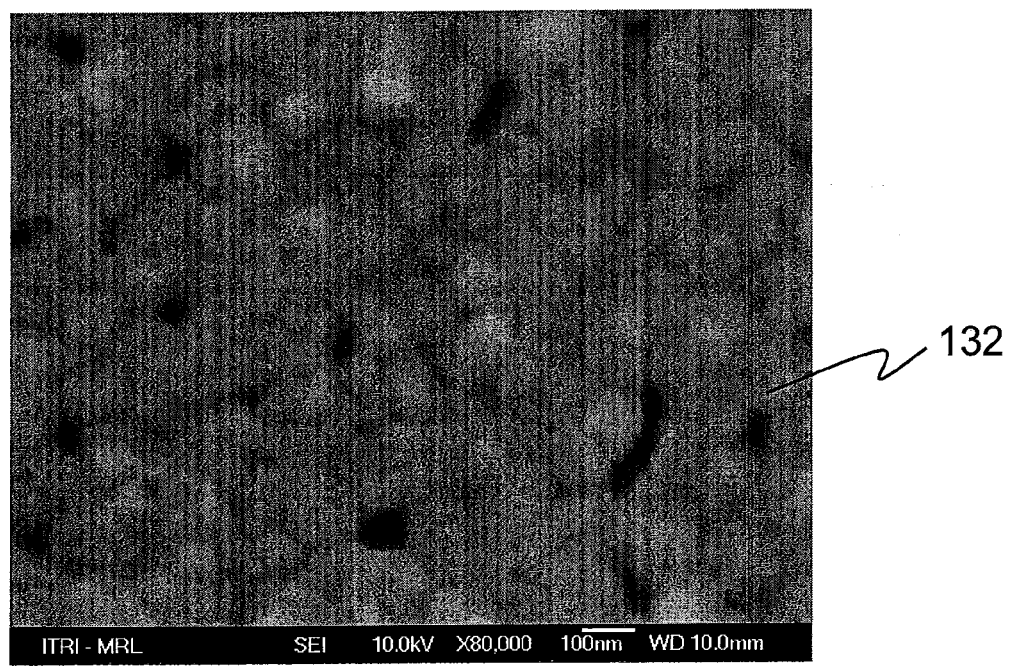
FIG. 23B is a micrograph view of a surface structure on a substrate observed with an electron microscope after being annealed in the eleventh example according to the method for manufacturing the substrate with the surface structure by employing photothermal effect of the present invention.

The Ag-nanoparticles with the particle size of about 25 nm were formed into a thin film on the substrate. The thin film of the Ag-nanoparticles was irradiated by a laser with an energy density of 159.2 W/mm$^2$, a power of 50 mW, a beam size of 20 μm, and a wavelength of 408 nm to anneal. Before being annealed, the SEI of the substrate with the thin film of the Ag-nanoparticles 130 formed on the surface thereof was observed with an electron microscope at the magnification of 80,000 and the working distance of 10 mm, as shown in FIG. 23A. After being annealed, the SEI of the substrate with melted Ag-nanoparticles 132 on the surface thereof was observed with the electron microscope at the magnification of 80,000 and the working distance of 10 mm, as shown in FIG. 23B. After being annealed, the Ag-nanoparticles 130 were obviously fused into larger particles. Moreover, as to the resistivity of the thin film of the Ag-nanoparticles 130, resistivity thereof was too large to measure before being annealed, but the resistance decreased to $1.48*10^{-6}$ Ωm after being annealed.

Example 12

Figure 24A:
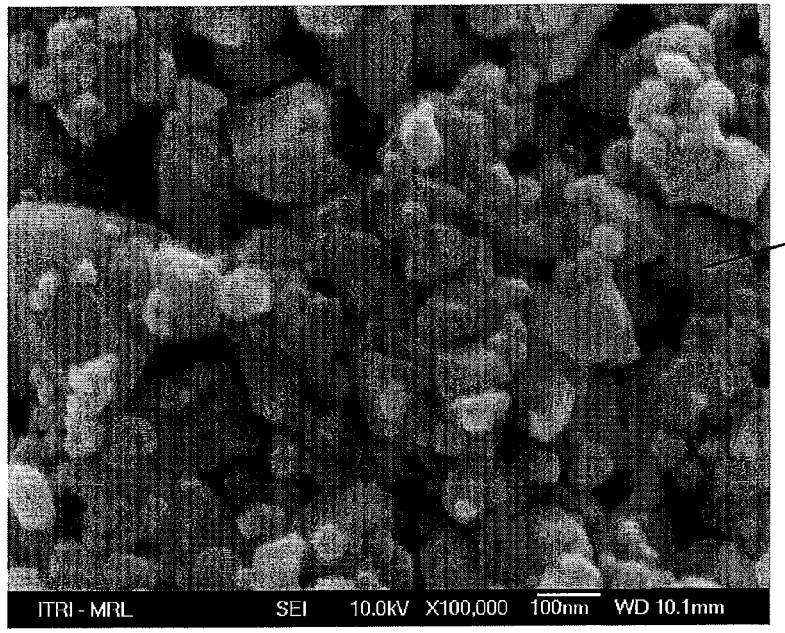
FIG. 24A is a micrograph view of a surface structure on a substrate observed with an electron microscope before being annealed in a twelfth example according to the method for manufacturing the substrate with the surface structure by employing photothermal effect of the present invention.
Figure 24B:
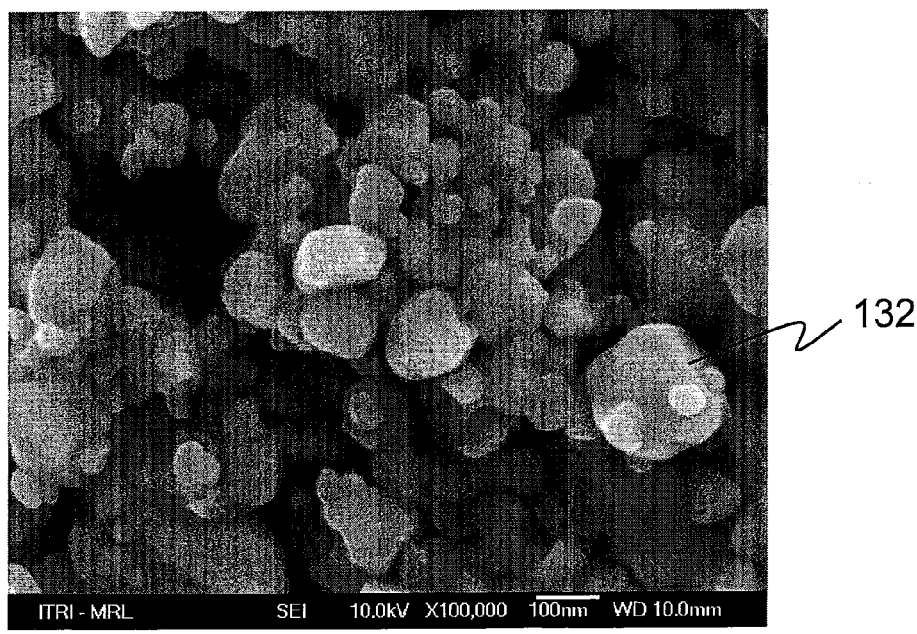
FIG. 24B is a micrograph view of a surface structure on a substrate observed with an electron microscope after being annealed in the twelfth example according to the method for manufacturing the substrate with the surface structure by employing photothermal effect of the present invention.

The Ag-nanoparticles with the particle sizes of about 40 nm and about 120 nm were formed into the thin film on the substrate. The thin film of the Ag-nanoparticles was irradiated by a laser with the energy density of 0.52 W/mm$^2$, the power of 50 mW, the beam size of 350 μm, and a wavelength of 408 nm to anneal. Before being annealed, the SEI of the substrate with the thin film of the Ag-nanoparticles 130 formed on the surface thereof was observed with an electron microscope at the magnification of 100,000 and the working distance of 10.1 mm, as shown in FIG. 24A. After being annealed, the SEI of the substrate with melted Ag-nanoparticles 132 on the surface thereof was observed with the electron microscope at the magnification of 100,000 and the working distance of 10 mm, as shown in FIG. 24B. After being annealed, the Ag-nanoparticles 130 with the particle sizes of about 40 nm were obviously fused with the Ag-nanoparticles 130 with the particle sizes of about 250 nm. Moreover, as to the resistivity of the thin film of the Ag-nanoparticles 130, resistance thereof decreased from $9.21*10^{-5}$ Ωm (before being annealed) to $3.04*10^{-7}$ Ωm (after being annealed).

In view of the above, with the method for manufacturing a substrate with surface structure by employing photothermal effect according to the present invention, the substrate with specific surface structure can be manufactured without employing a mask, the whole flow for manufacturing the substrate with specific surface structure is quite simple, the cost for manufacturing the substrate with specific surface structure is relatively low, and the substrates with specific surface structure and a large area may be easily manufactured in mass production. Furthermore, when the substrates with the specific surface structure and the large area are manufactured in mass production, devices and machines required by specific processes and steps and the corresponding technology may not be used, thereby the manufacturing cost is reduced. When manufacturing the substrate with layer of the predetermined pattern, residual stress can be reduced, as well as the thermal power, and adhesion between the predetermined pattern and the substrate can be increased. Further, energy loss can be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a substrate with surface structure by employing photothermal effect, comprising the steps of:

providing a first substrate;

distributing a plurality of nanoparticles on the provided first substrate, a particle size of each of the plurality of the nanoparticles being between 2.5 nm and 500 nm, a material of the nanoparticles being selected from a group consisting of Au, Cu, Ag and a combination thereof, said distributing including:

fixing the plurality of the nanoparticles on one side of a transparent substrate, the transparent substrate being transparent to light of a specific wavelength; and after fixing the plurality of the nanoparticles on said one side of the transparent substrate, placing the transparent substrate on the provided first substrate, wherein said one side of the transparent substrate is adjacent to the provided first substrate;

irradiating the plurality of the nanoparticles on the provided first substrate with the specific wavelength, so that the irradiated nanoparticles convert irradiating energy to thermal energy, at least a part of the irradiated nanoparticles existing and maintaining in a form of a nanoparticle after being irradiated;

forming a plurality of pores in a surface of the provided first substrate through the thermal energy, such that locations and shapes of the pores are at locations and have shapes of their respective irradiated nanoparticles; and after forming the pores, removing the irradiated nanoparticles in the form of the nanoparticle from the provided first substrate to obtain the first substrate with the pores formed, including:

removing the irradiated nanoparticles together with the transparent substrate from the provided first substrate to thus remove the irradiated nanoparticles from the provided first substrate to thus remove the irradiated nanoparticles from the pores.

2. The method of claim 1, wherein a melting temperature of the provided first substrate is equal to or lower than a temperature generated by the irradiated nanoparticles irradiated by the specific wavelength.

3. The method of claim 1, wherein
the provided first substrate has a surface layer, and
a melting temperature of the surface layer is equal to or lower than a temperature generated by the irradiated nanoparticles irradiated by the specific wavelength.

4. The method of claim 3, wherein the provided first substrate has at least one material selected from the group consisting of an organic material, an inorganic material, and a combination of the organic material and the inorganic material.

5. The method of claim 3, wherein the surface layer of the provided first substrate has at least one material selected from the group consisting of an organic material, an inorganic material, and a combination of the organic material and the inorganic-material.

6. The method of claim 1, wherein the provided first substrate has at least one material selected from the group consisting of an organic material, an inorganic material, a combination of the organic material and the inorganic material.

7. The method of claim 1, wherein the step of removing the irradiated nanoparticles in the form of nanoparticles from the provided first substrate to obtain the first substrate with the pores formed, comprises:
rinsing with a solution or blowing the provided first substrate, to remove residuals of the irradiated nanoparticles in the form of nanoparticles from the provided first substrate after obtaining the first substrate with the pores formed.

* * * * *